United States Patent
Kang et al.

(10) Patent No.: US 7,479,434 B2
(45) Date of Patent: Jan. 20, 2009

(54) SEMICONDUCTOR DEVICE AND METHOD OF MANUFACTURING THE SAME

(75) Inventors: Dong-Jo Kang, Suwon-si (KR); In-Sun Park, Yongin-si (KR); Dae-Joung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 202 days.

(21) Appl. No.: 11/497,362

(22) Filed: Aug. 2, 2006

(65) Prior Publication Data

US 2007/0029628 A1  Feb. 8, 2007

(30) Foreign Application Priority Data

Aug. 3, 2005  (KR) .................. 10-2005-0071052

(51) Int. Cl.
*H01L 21/336* (2006.01)

(52) U.S. Cl. .............. 438/301; 438/200; 438/201; 438/211; 438/300; 438/303; 438/305; 257/E21.149; 257/E21.151

(58) Field of Classification Search .......... 438/211, 438/279, 523, 533
See application file for complete search history.

(56) References Cited

U.S. PATENT DOCUMENTS

| 5,322,809 A | * | 6/1994 | Moslehi ............... 438/303 |
| 6,448,130 B1 | | 9/2002 | Kim |
| 6,838,366 B2 | | 1/2005 | Iwai |

FOREIGN PATENT DOCUMENTS

KR  1020000074605 A  12/2000
KR  10-2004-0007949  1/2004

OTHER PUBLICATIONS

Korean Patent Office Action dated Sep. 20, 2006 for corresponding Korean Patent Application No. 10-2005-0071052.

* cited by examiner

*Primary Examiner*—N Drew Richards
*Assistant Examiner*—Kyoung Lee
(74) *Attorney, Agent, or Firm*—Harness, Dickey & Pierce, P.L.C.

(57) ABSTRACT

A semiconductor device includes a gate structure formed on a substrate. The gate structure includes an uppermost first metal silicide layer pattern having a first thickness. Spacers are formed on sidewalls of the gate structure. One or more impurity regions are formed in the substrate adjacent to at least one sidewall of the gate structure. A second metal silicide layer pattern, having a second thickness thinner than the first thickness, is formed on the one or more impurity regions.

20 Claims, 22 Drawing Sheets

SEMICONDUCTOR DEVICE AND METHOD OF MANUFACTURING THE SAME

CROSS REFERENCE TO RELATED APPLICATION

This application claims priority under 35 USC § 119 to Korean Patent Application No. 2005-71052, filed on Aug. 3, 2005, the contents of which are herein incorporated by reference in their entirety for all purposes.

BACKGROUND

1. Field of the Invention

The present invention relates to a semiconductor device and a method of manufacturing the semiconductor device.

2. Description of the Related Art

As information-oriented societies have rapidly developed, so has a demand to process massive information, which translates to a demand for a highly-integrated semiconductor device that is capable of rapidly transmitting data. However, it becomes increasingly difficult to provide ever more highly-integrated semiconductor devices with operational characteristics.

For example, polysilicon doped with impurities has been used for a conductive pattern such as a gate electrode and a bit line. However, the polysilicon has a specific resistance higher than that of a metal. Thus, when the polysilicon is used for the conductive pattern having a minute line width, the conductive pattern has a very high resistance which hinders the semiconductor device vis-à-vis achieving the required operational characteristics.

Further, to suppress a short channel effect due to a shortening of a gate length in a transistor, it is required to increase a concentration of impurities in a channel region. However, increasingly higher concentrations of impurities cause increasing occurrences of abnormal tunneling currents.

To overcome the above-mentioned problems, methods of forming a metal silicide layer on a polysilicon layer pattern as a gate electrode and source/drain regions have been studied in the Background Art. To form the metal silicide layer on the polysilicon layer and the source/drain regions, a metal layer is formed on the polysilicon layer pattern and the source/drain regions. A thermal treatment is then carried out to drive a reaction between a metal in the metal layer and silicon in the polysilicon layer pattern and the source/drain regions.

However, to reduce a resistance of the gate electrode, it is needed to form the metal silicide layer relatively thickly on the polysilicon layer pattern. The thick metal silicide layer expands into the channel region as well as the source/drain regions.

FIG. 1 is a cross sectional view illustrating a conventional transistor including a metal silicide layer pattern according to the Background Art.

Referring to FIG. 1, a conventional transistor includes a semiconductor substrate 10. A gate oxide layer 12 is formed on the semiconductor substrate 10. A polysilicon layer pattern 14 is formed on the gate oxide layer 12. A first metal silicide layer pattern 20 is formed on the polysilicon layer pattern 14. Spacers 16 are formed on sidewalls of the polysilicon layer pattern 14. Source/drain regions 18 are formed in the semiconductor substrate 10 at both sides of the polysilicon layer pattern 14. The source/drain regions 18 are silicidated to form a second metal silicide layer 22.

Here, when the source/drain regions 18 are excessively silicidated, the second metal silicide layer pattern 22 expands into a channel region A as well as the source/drain regions. An expanded portion of the second metal silicide layer pattern 22 causes an increased junction leakage current, a reduced punch-through margin, a reduced breakdown voltage, etc.

Further, it is required to prevent formation of a metal silicide layer pattern on a polysilicon layer pattern in a specific region of a semiconductor device. The specific region may correspond to a peripheral region where peripheral circuits for driving cells of the semiconductor devices are formed. Particularly, the specific region may correspond to a region where the polysilicon layer pattern is used as a resistive load.

Furthermore, transistors having characteristics and structures different from each other are formed in various regions of a semiconductor substrate by very complicated processes respectively. While the complicated processes are performed, process failures are frequently generated so that the semiconductor device has inferior operational characteristics.

SUMMARY

One or more embodiments of the present invention provide a semiconductor device that includes a gate electrode having a low resistance and has good operational characteristics.

One or more embodiments of the present invention provide a method of manufacturing the above-mentioned semiconductor device.

An embodiment of the present invention provides a semiconductor device at least one region of which comprises: a gate structure formed on a substrate, the gate structure including an uppermost first metal silicide layer pattern that has a first thickness; a plurality of spacers formed on sidewalls of the gate structure; one or more impurity regions formed in the substrate adjacent to at least one sidewall of the gate structure; and a second metal silicide layer pattern formed on the one or more impurity regions, the second metal silicide layer pattern having a second thickness thinner than the first thickness.

An embodiment of the present invention provides a method of manufacturing one or more regions of a semiconductor device, the method comprising: forming a preliminary gate structure including an uppermost polysilicon layer pattern on a substrate; forming impurity regions in the substrate at both sides of the preliminary gate structure; forming spacers against sidewalls of the preliminary gate structure; forming a silicon oxide layer pattern having a thickness sufficiently thin so that a subsequent silicidation reaction occurs on a portion of the substrate between the spacers; forming a metal layer on the preliminary gate structure, the silicon oxide layer pattern and the spacers; and reacting the metal layer with the preliminary gate structure and the substrate underneath the silicon oxide layer pattern to form a gate structure and a second silicide layer pattern on the impurity regions, respectively, the gate structure including an uppermost first metal silicide layer pattern having a first thickness, and the second silicide layer pattern having a second thickness thinner than the first thickness.

According to one or more embodiments of the present invention, the semiconductor device including the impurity regions on which the metal silicide layer pattern is not formed may be manufactured.

Accordingly to one or more embodiments of the present invention, a semiconductor device can be manufactured which includes a metal silicide layer and yet has one or more impurity regions on which the metal silicide layer pattern is not formed.

Accordingly to one or more embodiments of the present invention, formation of the metal silicide pattern on the gate structure and on the impurity regions may be separately controlled. Thus, suitable transistors having different characteristics that are required in each of various regions of a semiconductor device may be formed.

Additional features and advantages of the present invention will be more fully apparent from the following detailed description of example embodiments, the accompanying drawings and the associated claims.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted. In particular, the relative and absolute sizes of layers and/or regions may be exaggerated for clarity.

The above and other features and advantages of the invention will become readily apparent by reference to the following detailed description when considered in conjunction with the accompanying drawings wherein.

DETAILED DESCRIPTION OF EXAMPLE EMBODIMENTS

Figure 1:
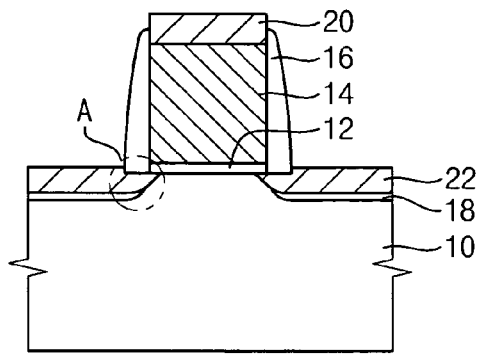
FIG. 1 is a cross sectional view illustrating a conventional transistor including a metal silicide layer pattern according to the Background Art.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the invention to those skilled in the art.

It will be understood that if an element or layer is referred to as being "on," "against," "connected to" or "coupled to" another element or layer, then it can be directly on, against, connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a term such as "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
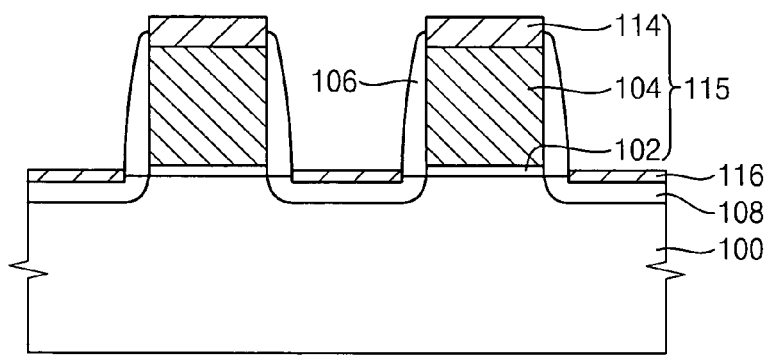
FIG. 2 is a cross sectional view illustrating a semiconductor device in accordance with an example embodiment of the present invention.

FIG. 2 is a cross sectional view illustrating a semiconductor device in accordance with an example embodiment of the present invention.

Referring to FIG. 2, a gate structure 115 is formed on a semiconductor substrate 100. The gate structure 115 includes a gate oxide layer pattern 102, a polysilicon layer pattern 104 and a first metal silicide layer pattern 114 sequentially stacked. Here, the first metal silicide layer pattern 114 has a first thickness. The first thickness of the first metal silicide layer pattern 114 is appropriate to provide the gate structure 114 with a low resistance that is required in a semiconductor device. An example of the first metal silicide layer pattern 114 includes a cobalt silicide layer.

Spacers 106 are formed on sidewalls of the gate structure 115. An example of a material that is used for the spacer 106 includes silicon nitride.

Source/drain regions 108 doped with impurities are formed in the semiconductor substrate 100 adjacent to the sidewall of the gate structure 115.

A second metal silicide layer pattern 116 is formed on the source/drain regions 108. The second metal silicide layer pattern 116 has a second thickness thinner than the first thickness.

According to this example embodiment (namely, the semiconductor device of FIG. 2), because the second thickness of the second metal silicide layer pattern 116 is thinner than the first thickness of the first metal silicide layer pattern 114, unacceptable expansion of the second metal silicide layer pattern 116 into a channel region under the gate structure 115 can be at least reduced (if not prevented) so that an increase of a junction leakage current, a decrease of a punch-through margin, a reduction of a breakdown voltage, etc., may be suppressed. Further, since the first metal silicide layer pattern 114 has the thick first thickness, the gate structure 115 may have a relatively low resistance.

FIGS. 3 to 7 are cross sectional views some stages (most of which are intermediary) of a method, according to an example embodiment of the present invention, for manufacturing the semiconductor device in FIG. 2.

Figure 3:
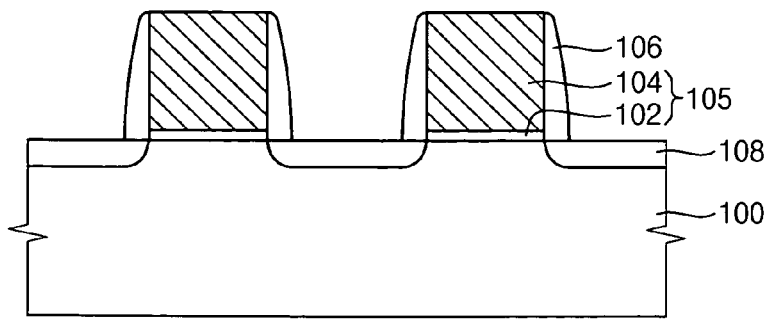
FIGS. 3 to 7 are cross sectional views illustrating some stages (most of which are intermediary) of a method, according to an example embodiment of the present invention, for manufacturing the semiconductor device in FIG. 2.

Referring to FIG. 3, a gate oxide layer (not shown) and a polysilicon layer (not shown) are sequentially formed on a semiconductor substrate 100 including a semiconductor material such as silicon. The gate oxide layer and the polysilicon layer are patterned by a photolithography process to form a preliminary gate structure 105 including a gate oxide layer pattern 102 and a polysilicon layer pattern 104.

Spacers 106 are formed on sidewalls of the preliminary gate structure 105. Impurities, e.g., in Group III or V, are implanted into the semiconductor substrate 100 adjacent to the sidewalls of the preliminary gate structure 115 to form source/drain regions 108.

Alternatively, an ion implantation process for forming the source/drain regions 108 may be carried out before forming the spacers 106. Further, such an ion implantation process for forming the source/drain regions 108 may be performed more than once.

Figure 4:
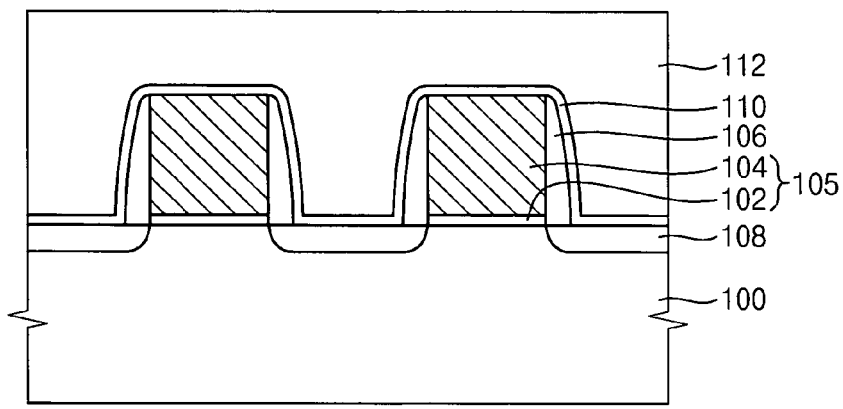

Referring to FIG. 4, a silicon oxide layer 110 is formed on the preliminary gate structure 105, the spacers 106 and the semiconductor substrate 100. Here, without being bound by theory, the silicon oxide layer 110 functions to control a silicidation reaction of the portion of the semiconductor substrate 100 located between the preliminary gate structures 105, as described below.

A photoresist film 112 is formed on the silicon oxide layer 110. A first portion of the photoresist film 112 over the semiconductor substrate 100 located between the preliminary gate structures 105 has a thickness greater than that of a second portion of the photoresist film 112 over the preliminary gate structures 105.

Figure 5:
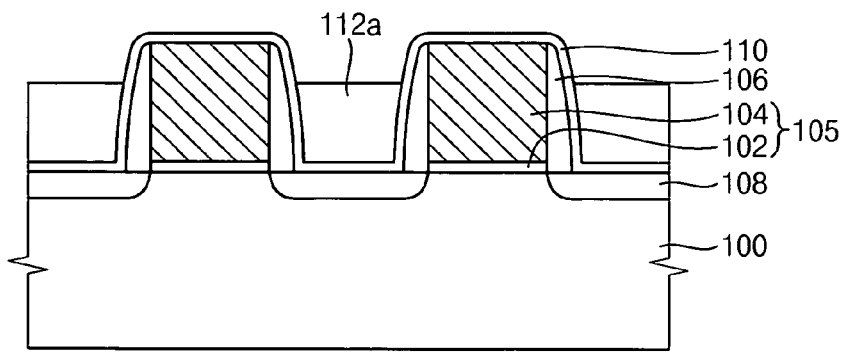

Referring to FIG. 5, the photoresist film 112 is blank-exposed. Here, the blank-exposing process is carried out under conditions that the first portion of the photoresist film 112 is not sufficiently exposed and the second portion of the photoresist film 112 (which is thinner than that of the first portion) is sufficiently exposed.

The exposed photoresist film 112 is developed to form a photoresist pattern 112a selectively masking a space between the preliminary gate structures 105. Here, the photoresist pattern 112a formed by the above-mentioned processes is referred to as a photoresist plug.

Figure 6:
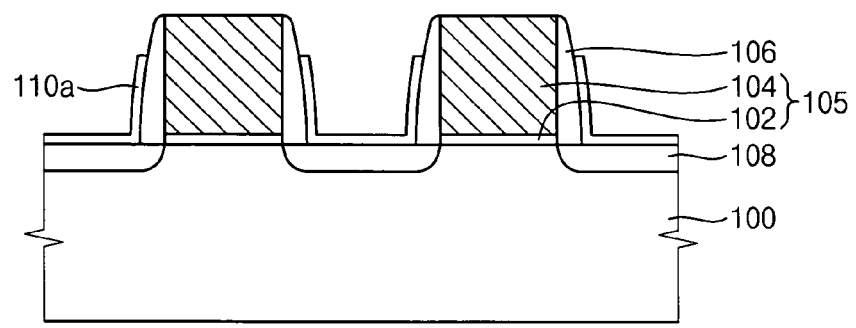

Referring to FIG. 6, the silicon oxide layer 110 is etched using the photoresist pattern 112a as an etching mask to form a silicon oxide layer pattern 110a.

The photoresist pattern 112a is then removed, e.g., by an ashing process and/or a stripping process. Here, the silicon oxide layer pattern 110a may be partially removed when removing the photoresist pattern 112a so that the silicon oxide layer pattern 110a may have a reduced thickness. Again (without being bound by theory), the silicon oxide layer pattern 110a functions to control a silicidation reaction of the portion of the semiconductor substrate 100 located between the preliminary gate structures 105.

That is, when the silicon oxide layer pattern 110a is relatively thick, the silicidation reaction is not generated in the portion of the semiconductor substrate 100 located between the preliminary gate structures 105 so that a metal silicide layer pattern is not formed on the source/drain regions 108.

On the contrary, when the silicon oxide layer 110a is relatively thin, then the silicidation reaction is not prevented, and so a metal silicide layer pattern is formed on the source/drain regions 108 (described further below). To be sufficiently thin so that the metal silicide layer pattern on the source/drain regions 108 is formed readily, the silicon oxide layer pattern 110a may have a thickness of, e.g., about 20 Å to about 1,000 Å.

Figure 7:
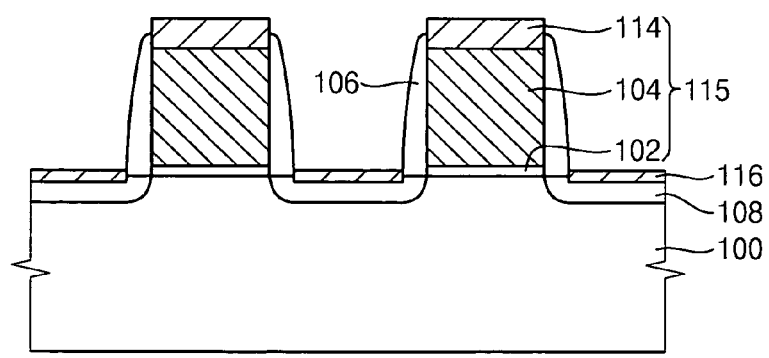

Referring to FIG. 7, a metal layer (not shown) is formed on the preliminary gate structures 105, the silicon oxide layer pattern 110a and the spacer 106. For example, cobalt may be deposited by a physical vapor deposition (PVD) process, a chemical vapor deposition (CVD) process, etc., to form the metal layer.

A capping layer (not shown), e.g., a titanium nitride layer, is formed on the metal layer. The titanium nitride layer serves (without being bound by theory) to prevent heat, which is generated in a thermal treatment process used for silicidating the semiconductor substrate 100, from being directly transmitted into the metal layer. Further, without being bound by theory, the titanium nitride layer is chemically reacted with oxygen in the silicon oxide layer pattern 110a interposed between the semiconductor substrate 100 and the metal layer so that the silicidation reaction may occur regardless of the existence of the silicon oxide layer pattern 110a between the semiconductor substrate 100 and the metal layer.

The metal layer is thermally treated to form a first metal silicide layer pattern 114 on the preliminary gate structures 105, and a second metal silicide layer pattern 116 on the portion of the semiconductor substrate 100 located between the preliminary gate structures 105, thereby completing a gate structure 115 including the first metal silicide layer pattern 114. The thermal treatment may include, e.g., a rapid thermal process. Further, the thermal treatment may be carried out at least once under a condition in which temperatures are altered in each of the thermal treatments.

Here, since the silicon oxide layer pattern 110a is formed on the portion of the semiconductor substrate 100 located between the preliminary gate structures 105, silicidation reactivity of the portion of the semiconductor substrate 100 between the preliminary gate structures 105 is lower than that of the polysilicon layer pattern 104. Thus, the resulting second metal silicide layer pattern 116 has a thickness thinner than that of the first metal silicide layer pattern 114.

According to this example embodiment (namely, the example method some of whose stages are depicted in FIGS. 3-7), the silicon oxide layer pattern 110a is formed on the portion of the semiconductor substrate 100 located between the preliminary gate structures 105 using the photoresist plug 112a that is formed by the blank-exposing process. Further, the thicknesses of the first metal silicide layer pattern 114 in the gate structure 115 and the second metal silicide layer pattern 116 on the source/drain regions 108 may be separately controlled by controlling the thickness of the silicon oxide layer pattern 110a.

Figure 8:
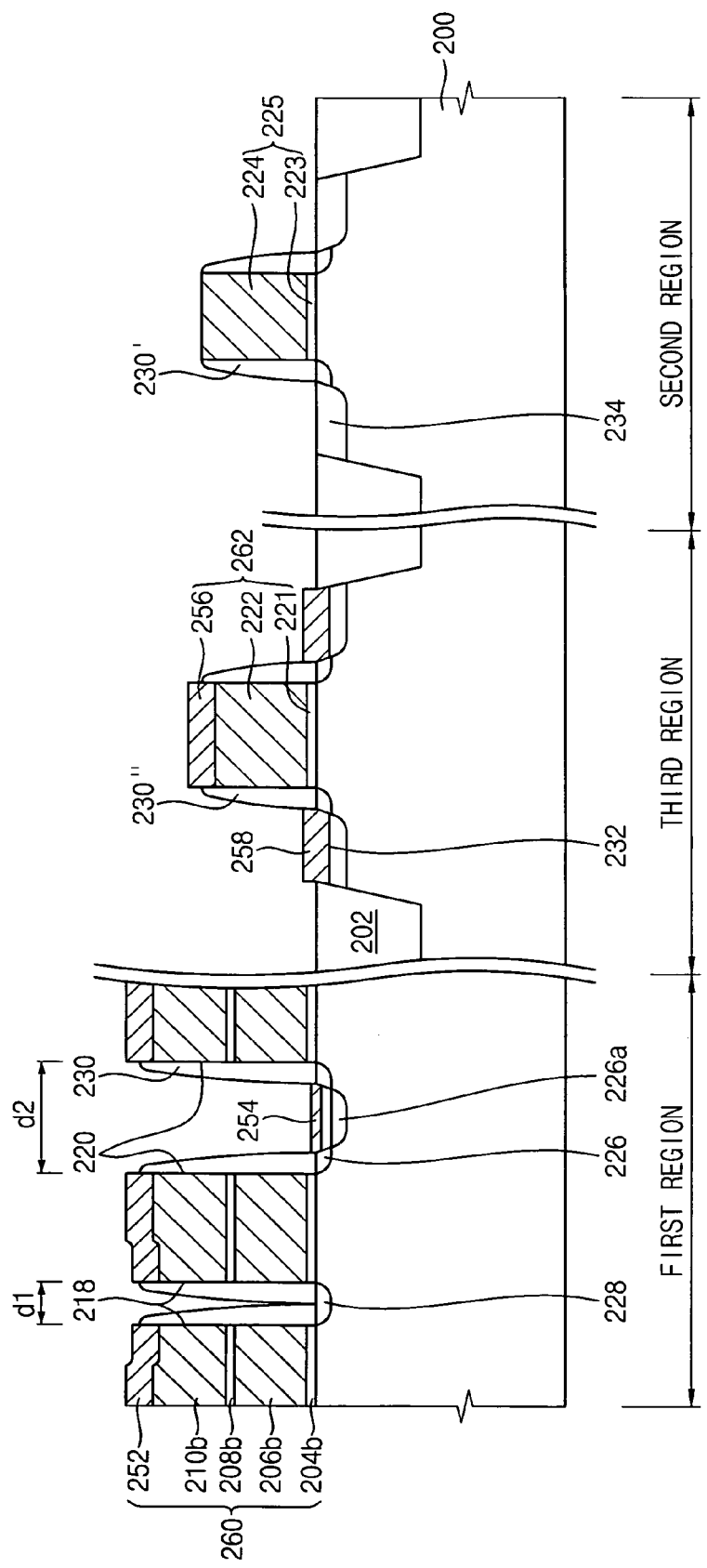
FIG. 8 is a cross sectional view illustrating a semiconductor device in accordance with an example embodiment of the present invention.

FIG. 8 is a cross sectional view illustrating a semiconductor device in accordance an embodiment of the present invention.

Referring to FIG. 8, a semiconductor substrate 200 includes a first region where a non-volatile memory cell is formed, a second region where non-silicided transistors (i.e., that do not include a silicide layer pattern), are formed, and a third region where high or low voltage transistors are formed. The first region may correspond to a cell region. The second and third regions may correspond to a peripheral region.

Isolation layers 202 for defining an active region and an isolation region of the semiconductor substrate 200 are formed in the first, second and third regions, respectively.

Hereinafter, a first transistor formed in the first region is illustrated in detail.

A first gate structure 260 is formed on the semiconductor substrate 200 in the first region. The first gate structure 260 includes a tunnel oxide layer pattern 204b, a floating gate structure 206b, a dielectric layer pattern 208b and a control gate structure sequentially stacked. Each instance of the first gate structure 260 has a first sidewall 218 and a second sidewall 220. In general, instances of the first gate structure 260 are arranged so that the first sidewalls 218 face each other and so that the second sidewalls face each other.

The control gate structure includes a second polysilicon layer pattern 210b and a first metal silicide layer pattern 252 sequentially stacked. The first metal silicide layer pattern 252 has a first thickness. The first thickness of the first metal silicide layer pattern 252 functions to provide the control gate structure 252 with a low resistance that is required in a semiconductor device. An example of the first metal silicide layer pattern 252 includes a cobalt silicide layer. The control gate structure has a substantially linear shape extending in a first direction that traverses the semiconductor substrate 200.

A first interval (or gap) d1 between opposing first sidewalls 218 of adjacent first and second instances of the first gate structure 260 is narrower than that a second interval (or gap) d2 between opposing second sidewalls 220 of adjacent first and third instances of the first gate structure 260. That is, intervals among the first gate structures 260 are different from one another.

A spacer 230 is formed on the sidewall of the first gate structure 260. An example of a material that is used for the spacer 230 includes silicon nitride.

Here, the widths of the lower portion of the spacer 230 on the first sidewall 218 of the first instance of the gate structure 260 and of the opposing spacer 230 on the sidewall 218 of the adjacent second instance of the first gate structure 260 are substantially about half of the first interval d1, respectively. Thus, the spacer 230 positioned against the first instance of the first gate structure 260 makes contact with the spacer 230 positioned against the adjacent second instance of the first gate structure 260. As a result, since the semiconductor substrate 200 located between the first sidewalls 218 of the adjacent first and second instances of the first gate structure 260 and the adjacent first gate structure is covered with the spacers 230, the semiconductor substrate 200 between the first sidewalls 218 of the adjacent first and second instances of the first gate structure 260 is not exposed.

On the contrary, the widths of the lower portion of each of the spacer 230 positioned against the second sidewall 220 of the first instance of the first gate structure 260 and the second sidewall 220 of a third instance of the first gate structure 260 are narrower than about half of the second interval d2. Thus, the semiconductor substrate 200 located between the second sidewalls 220 of the first and third instances of the first gate structure 260 is partially exposed.

A source region 228 and a drain region 226 doped with impurities are formed in the semiconductor substrate 200 adjacent to the sidewall 218 and the sidewall 220 of the first instance of the first gate structure 260, respectively. That is, the source region 228 is positioned in the semiconductor substrate 200 adjacent to the first sidewall 218 of the first instance of the first gate structure 260. Further, the source region 228 has a substantially linear shape extending in the first direction. The drain region 226 is positioned in the semiconductor substrate 200 adjacent to the second sidewall 220 of the first instance of the first gate structure 260.

A second silicide layer pattern 254 is formed on the drain region 226. The second silicide layer pattern 254 has a second thickness thinner than the first thickness.

Hereinafter, a second transistor formed in the second region is illustrated in detail.

A second gate structure 225 is formed on the semiconductor substrate 200 in the second region. The second gate structure 225 includes a first gate oxide layer pattern 223 and a third polysilicon layer pattern 224 sequentially stacked. The third polysilicon layer pattern 224 is doped with impurities.

A spacer 230', e.g., including silicon nitride, is formed on a sidewall of the second gate structure 225.

Second source/drain regions 234 doped with impurities are formed in the semiconductor substrate 200 adjacent to the second gate structure 252. Here, a metal silicide layer pattern is neither formed on the third polysilicon layer pattern 224 nor on the source/drain regions 234 at both sides of the second gate structure 225.

Hereinafter, a third transistor formed in the third region is illustrated in detail.

The third transistor of this example embodiment (namely, the semiconductor device of FIG. 8) has an operational voltage higher than that of the non-volatile memory cell.

A third gate structure 262 is formed on the semiconductor substrate 200 in the third region. The third gate structure 262 includes a second oxide layer pattern 221 and a second gate conductive layer pattern.

The second gate conductive layer pattern includes a fourth polysilicon layer pattern 222 doped with impurities, and a third metal silicide layer pattern 256 sequentially stacked. Here, the second gate oxide layer pattern 221 has a thickness thicker those of the tunnel oxide layer pattern 204b and the first gate oxide layer pattern 223.

A spacer 230", e.g., including silicon nitride, is formed on a sidewall of the third gate structure 262. The spacer 230" may have a thickness thicker than that of the spacer on the sidewall of the first gate structure 260.

Third source/drain regions 232 doped with impurities are formed in the semiconductor substrate 200 adjacent to the third gate structure 262. A fourth metal silicide layer pattern 258 is formed on the third source/drain regions 232. The fourth metal silicide layer pattern 258 has a thickness substantially similar to that of the third metal silicide layer pattern 256.

According to this example embodiment (namely, the semiconductor device of FIG. 8), a first type of transistor having the first gate structure including the first metal silicide layer pattern 252 having the first thickness, the impurity regions 226 and 228, and the second silicide layer pattern 254 having the second thickness thinner than the first thickness are formed in the first region. Thus, unacceptable expansion of the second metal silicide layer pattern into a channel region under the first gate structure 260 can at least be reduced (if not prevented) so that an increased junction leakage current, a decreased punch-through margin, a reduced breakdown voltage, etc., may be suppressed.

Further, according to this example embodiment (namely, the semiconductor device of FIG. 8), a third type of transistor including the third gate structure 262 and the source/drain regions 232 is formed in the third region. Particularly, the third and fourth metal silicide layer patterns 256 and 258 having the substantially similar thickness are formed on the third gate structure 262 and the source/drain regions 232, respectively, in the third region so that the third type of transistor may have a sufficiently low resistance.

As described above, the first, second and third transistors having desired characteristics, respectively, are formed in the cell region and the peripheral region of the semiconductor device. Thus, the semiconductor device may have good operational characteristics.

FIGS. 9 to 18 are cross sectional views illustrating some stages (most of which are intermediary) of a method, according to an example embodiment of the present invention, for manufacturing the semiconductor device in FIG. 8.

Figure 9:
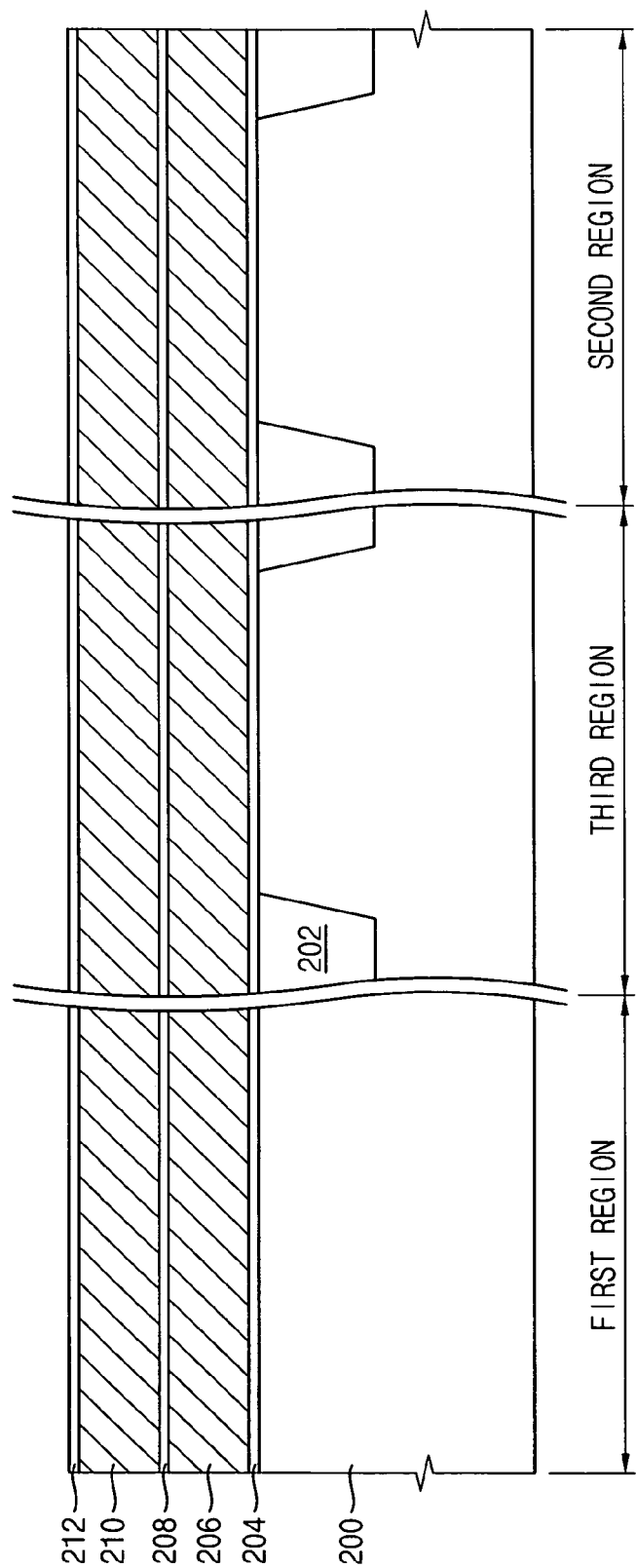
FIGS. 9 to 18 are cross sectional views illustrating some stages (most of which are intermediary) of a method, according to an example embodiment of the present invention, for manufacturing the semiconductor device in FIG. 8.

Referring to FIG. 9, a semiconductor substrate 200 is prepared. The semiconductor substrate 200 includes a first region (e.g., where a non-volatile memory cell is to be formed), a second region where non-silicidated transistors (i.e., that do not include a silicide layer pattern) are formed, and a third region where high or low voltage transistors are formed. The first region may correspond to a cell region. The second and third regions may correspond to a peripheral region.

Isolation layer patterns 202 are formed in the semiconductor substrate 200 by a trench isolation process to arrange the first, second and third regions of the semiconductor substrate 200 as an active region and an isolation region. Here, the isolation layer patterns 202 have a protruded portion protruded from a surface of the semiconductor substrate 200 in the active region. That is, underneath the isolation layer patterns 202, there is the semiconductor substrate 200 such that a bottom face of a given isolation pattern 202 is formed on an upper surface of the semiconductor substrate 200. Further, the isolation layer patterns 202 have a substantially linear shape extending in a first direction that traverses the semiconductor substrate 200.

A tunnel oxide layer 204 is formed on the semiconductor substrate 200 in the active region. The tunnel oxide layer 204 may include, i.e., a silicon oxide layer formed, e.g., by a thermal oxidation process. Alternatively, the tunnel oxide layer 204 may include, e.g., a dielectric layer having a dielectric constant higher than the silicon oxide layer.

A first polysilicon layer (not shown) doped with impurities, which is used for a floating gate electrode, is formed on the tunnel oxide layer 204 and the isolation layer pattern 202. The first polysilicon layer may be formed, e.g., by a low pressure chemical vapor deposition (LPCVD) process.

The first polysilicon layer is removed, e.g., by a chemical mechanical polishing (CMP) process until surfaces of the isolation layer pattern 202 are exposed to form a first preliminary polysilicon layer pattern 206.

Here, FIG. 9 is the cross sectional view taken along the first direction. Thus, although the shape of the first preliminary polysilicon layer pattern 206 in FIG. 9 is not distinctly recognized, the first preliminary polysilicon layer pattern 206 has a substantially linear shape extending in the first direction. Upper portions of the isolation layer pattern 202 are partially removed, e.g., by a wet etching process to expose sidewalls of the first preliminary polysilicon layer pattern 206.

A dielectric layer 208 is formed on the first preliminary polysilicon layer pattern 206 and the isolation layer patterns 202. Examples of the dielectric layer 208 include a composite dielectric layer, e.g., an oxide/nitride/oxide (ONO) layer, a dielectric layer having a high dielectric constant, etc.

A second polysilicon layer 210 doped with impurities is formed on the dielectric layer 208. The second polysilicon layer 210 may be formed, e.g., by an LPCVD process. Further, the second polysilicon layer 210 may be doped with the impurities, e.g., by an in-situ doping process.

A buffer oxide layer 212 is formed on the second polysilicon layer 210. The buffer oxide layer 212 may include a material having a high etching selectivity with respect to the second polysilicon layer 210. That is, the buffer oxide layer 212 includes a material that substantially would not be removed/etched by something that would etch/remove the second polysilicon layer 210. The buffer oxide layer 212 may include, e.g., a silicon oxide layer and a silicon nitride layer sequentially formed. Here, without being bound by theory, the buffer oxide layer 212 serves to reduce stresses generated when the silicon nitride layer directly makes contact with the second polysilicon layer 210.

Figure 10:
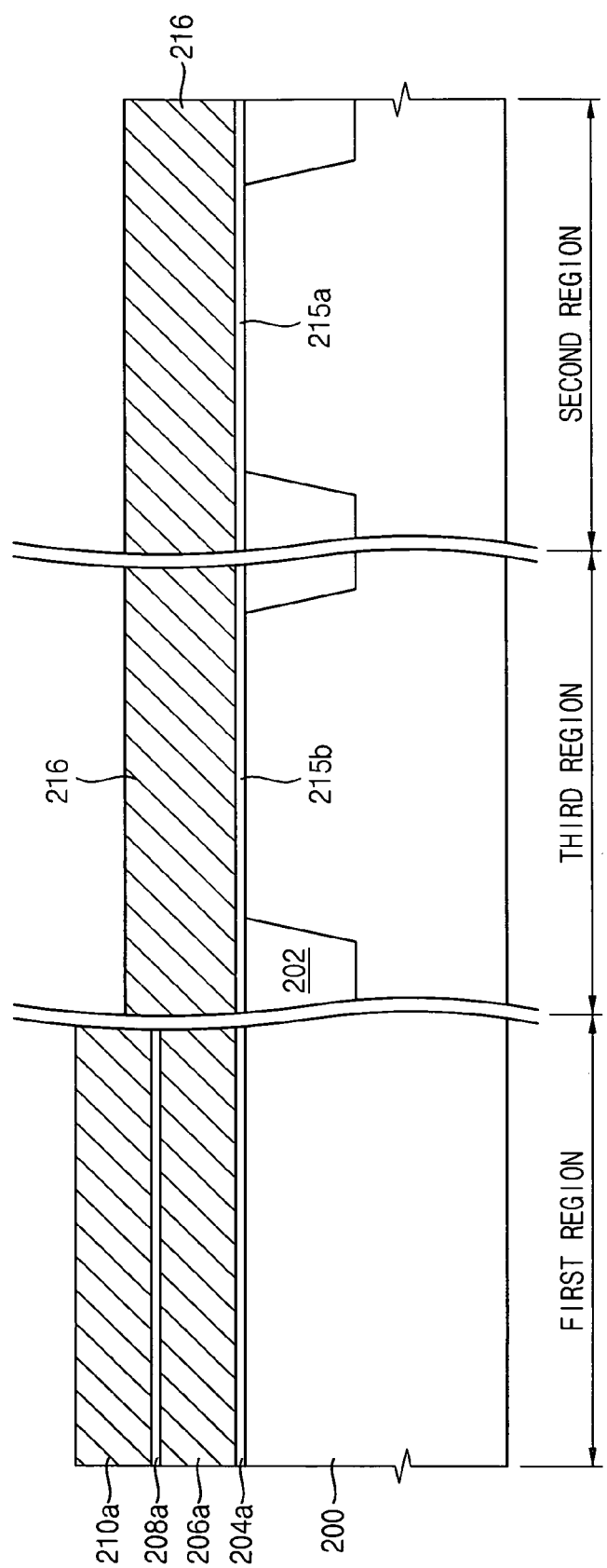

Referring to FIG. 10, the tunnel oxide layer 202, the first preliminary polysilicon layer 206, the dielectric layer 208, the second polysilicon layer and the buffer oxide layer 212 in the second and third regions are selectively removed to expose the underlying surfaces of the semiconductor substrate 200 in the second and third regions.

Hereinafter, the above removing process will be explained in detail.

Returning again to FIG. 9, a photoresist film (not shown) is formed on the buffer oxide layer 212. The photoresist film is exposed and developed to form a photoresist pattern (not shown) selectively exposing the underlying buffer oxide layer 212 in the second and third regions. The tunnel oxide layer 202, the first preliminary polysilicon layer 206, the dielectric layer 208, the second polysilicon layer and the buffer oxide layer 212 in the second and third regions are sequentially etched using the photoresist pattern as an etching mask to expose the underlying surface of the semiconductor substrate 200. Simultaneously, a preliminary tunnel oxide layer pattern 204a, a first polysilicon layer pattern 206a, a preliminary dielectric layer pattern 208a, a second preliminary polysilicon layer pattern 210a and a buffer oxide layer pattern (not shown) are formed in the first region. After the etching process is completed, the photoresist pattern is removed, e.g., by an ashing process and/or a stripping process.

Referring again to FIG. 10, first and second gate oxide layers 215a and 215b are formed on the exposed surface of the semiconductor substrate 200 in the second and third regions. The first and second gate oxide layers 215a and 215b may be formed, e.g., by a thermal oxidation process, a CVD process, etc. Alternatively, the first and second gate oxide layers 215a and 215b may have a thickness different from that of the preliminary tunnel oxide layer pattern 204a. Further, the first and second gate oxide layer patterns 215a and 215b may have thicknesses different from each other.

To access unit cells in the cell region, for example, a high voltage MOS transistor can be formed in the third region. Since a relatively high voltage is applied to source/drain regions of the high voltage MOS transistor, the second gate oxide layer 215b should be formed so as to be relatively thick for preventing an insulation breakdown. Therefore, when the second gate oxide layer 215b and the preliminary tunnel oxide layer pattern 204a include substantially the same material, the second gate oxide layer 215b should be relatively thicker than the preliminary tunnel oxide layer pattern 204a.

A third polysilicon layer (not shown) that is used for a gate electrode in the second and third regions is formed on the first and second oxide layer patterns 214a and 215b, and the buffer oxide layer pattern. For example, doped polysilicon or undoped polysilicon may be deposited by an LPCVD process to form the third polysilicon layer. When the third polysilicon layer includes the undoped polysilicon, then the third polysilicon layer may be doped with impurities in a subsequent process for forming the source/drain regions.

A photoresist film (not shown) is formed on the semiconductor substrate 200 and the third polysilicon layer. The photoresist film is exposed and developed to form a photoresist pattern (not shown) selectively exposing the third polysilicon layer in the first region.

The third polysilicon layer in the first region is etched using the photoresist pattern as an etching mask. The buffer oxide layer beneath the polysilicon layer is then etched. As a result, a third preliminary polysilicon layer pattern 216 is formed in the second and third regions. Simultaneously, the second preliminary polysilicon layer pattern 210a in the first region is exposed.

The photoresist pattern is then removed, e.g., by an ashing process and/or a stripping process.

Referring again to FIG. 10, an etching mask (not shown), which is to be used for patterning a first gate structure, is formed on the second preliminary polysilicon layer pattern 210a and the third preliminary polysilicon layer pattern 216. The second preliminary polysilicon layer pattern 210a, the preliminary dielectric layer pattern 208a, the first polysilicon layer pattern 206a and the preliminary tunnel oxide layer pattern 204a are patterned using the etching mask.

Figure 11:
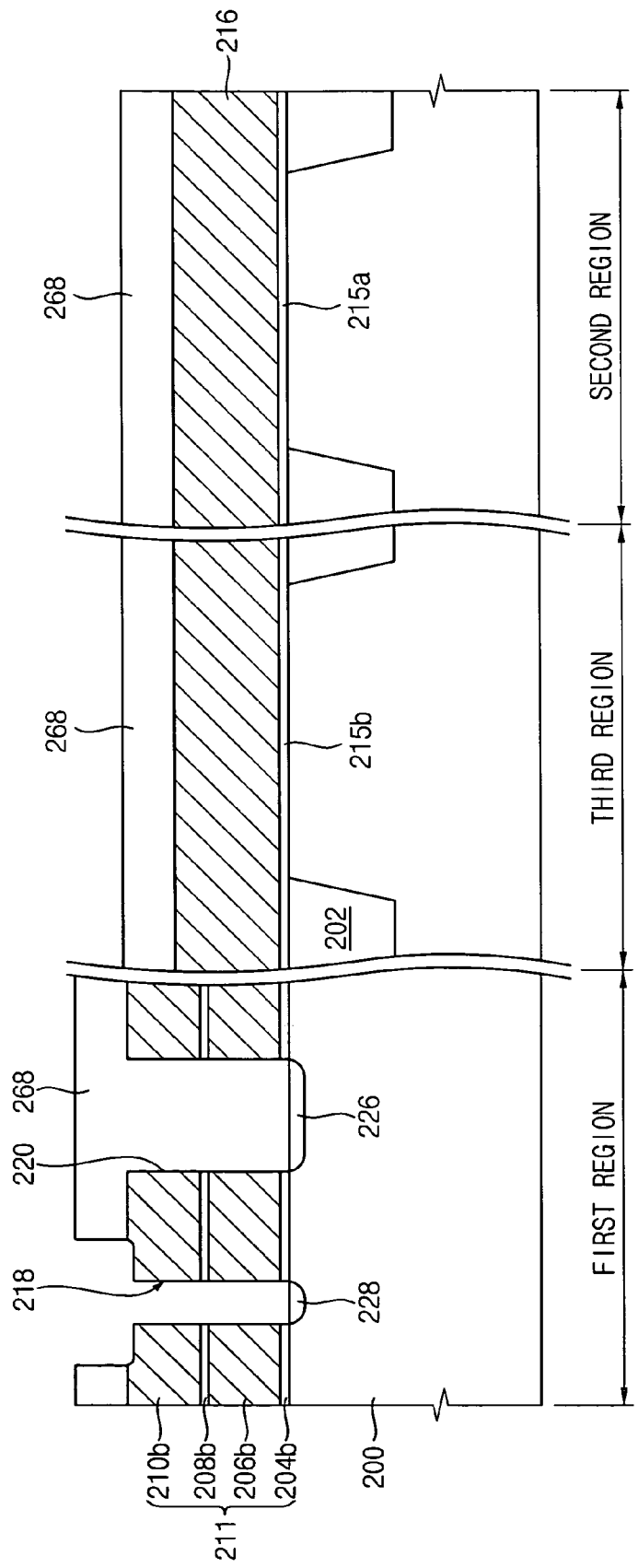

Referring to FIG. 11, such patterning forms a first preliminary gate structure 211 including a tunnel oxide layer pattern 204b, a floating gate structure 206b, a dielectric layer pattern 208b and a second polysilicon layer pattern 210b. Here, the second polysilicon layer pattern 210b has a substantially-global linear shape extending a second direction substantially perpendicular to the first direction. Further, since the floating gate structure 206b is formed by patterning in both of the first and second directions, the floating gate structure 206b has an isolated island shape.

Impurities are implanted into the semiconductor substrate 200 having the first preliminary gate structure 211 to form a preliminary source region and a drain region 226. The preliminary source region has a substantially linear shape.

A photoresist film (not shown) is then formed on the first preliminary gate structure 211 and the semiconductor substrate 200. The photoresist film is exposed and developed to form a first photoresist pattern 268 in the cell region selectively exposing the linear preliminary source region.

Here, the linear preliminary source region includes a region between source portions in the second direction as well as a source portion of a cell transistor in the active region. Thus, the first photoresist pattern 268 has a substantially linear shape extending in the second direction to expose the upper faces of the isolation layer pattern 202 between the source portions in the second direction as well as the active region that is provided as the source portion of the cell transistor in a non-volatile memory device.

The first photoresist pattern 268 serves as an etching mask for selectively removing the isolation layer patterns 202 in the linear preliminary source region and an ion implantation mask for implanting impurities into the linear preliminary source region.

The isolation layer patterns 202 may be removed by, e.g., a self-alignment etching process using an etching selectivity between, e.g., silicon and silicon oxide. Thus, to sufficiently expose the linear preliminary source region through the first photoresist pattern 268, the first photoresist pattern 268 may have an opening wider than a width of the linear preliminary source region.

Using the first photoresist pattern 268, the isolation layer patterns 202 in the first region are etched to expose the linear preliminary source region. Impurities are then implanted into the linear preliminary source region using the first photoresist pattern 268 as an ion implantation mask to form a linear source region 228. The first photoresist pattern 268 is removed by, e.g., an ashing process and/or a stripping process.

Then a photoresist film (not shown) is formed on the first preliminary gate structure 211, the semiconductor substrate 200 and the third preliminary polysilicon layer pattern 216. The photoresist film is then exposed and developed to form a photoresist pattern (not shown) for forming second and third gate structures in second and third regions, respectively. The third preliminary polysilicon layer 216 and the first and second gate oxide layers 215a and 215b are selectively etched using the photoresist pattern as an etching mask.

Figure 12:
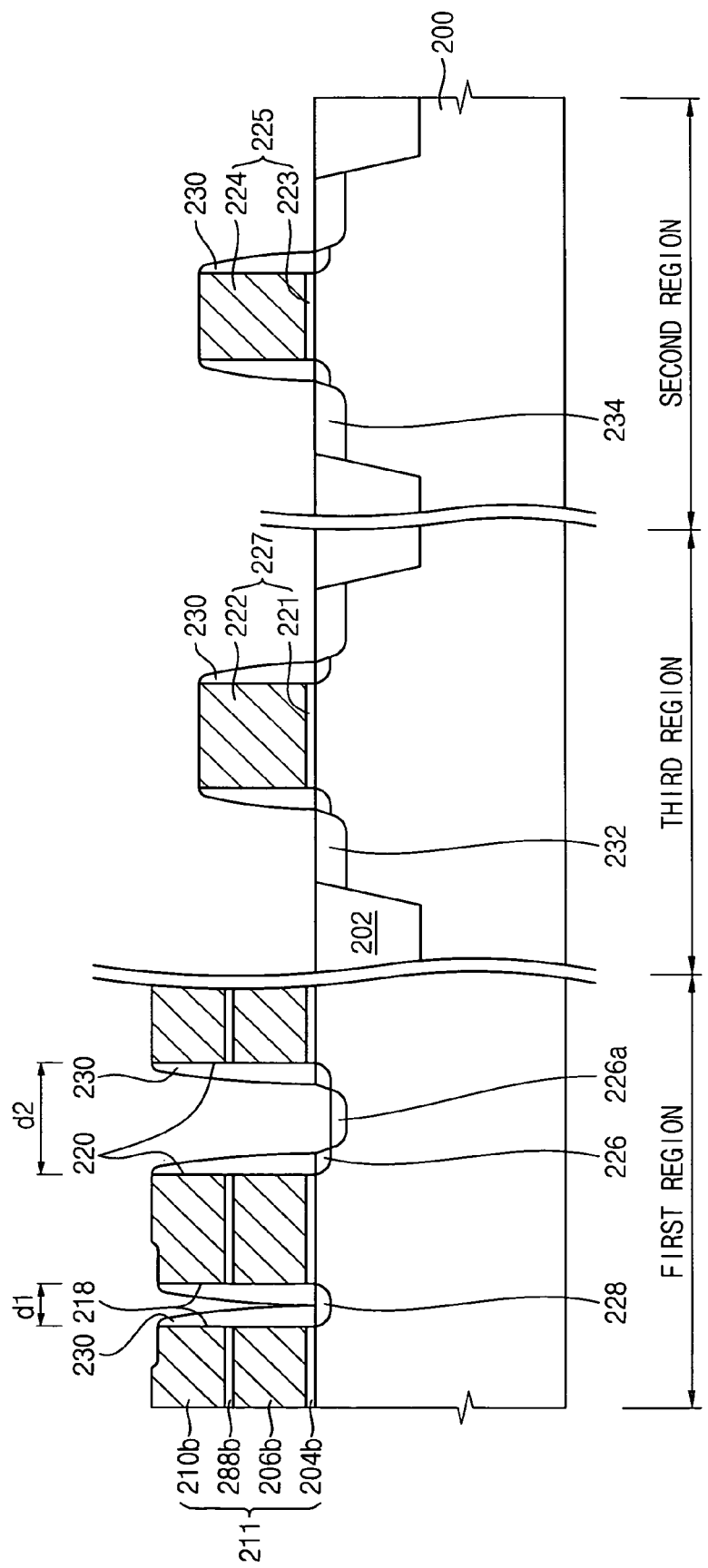

Referring to FIG. 12, such etching forms a second gate structure 225 in the second region and a third preliminary gate structure 227 in the third region. The second gate structure 225 includes a first gate oxide layer pattern 223 and a third polysilicon layer pattern 224 sequentially stacked. The third preliminary gate structure 227 includes a second gate oxide layer pattern 221 and a fourth polysilicon layer pattern 222 sequentially stacked.

Impurities are then implanted into the semiconductor substrate 200 adjacent to the second gate structure 225 and the third preliminary gate structure 227 to form second source/drain regions 234 and third source/drain regions 232, respectively.

A silicon nitride layer (not shown) is formed on the first preliminary gate structure 211, the semiconductor substrate 200, the second gate structure 225 and the third preliminary gate structure 227. The silicon nitride layer is etched, e.g., anisotropically, to form spacers on sidewalls of the first preliminary gate structure 211, the second gate structure 225 and the third preliminary gate structure 227.

Here, a first interval d1 between a first sidewall 218 of the first preliminary gate structure 211 and an adjacent first preliminary gate structure is narrower that a second interval d2 between a second sidewall 220 of the first preliminary gate structure 211 (opposite to the first sidewall 218) and another adjacent first preliminary gate structure.

Further, the silicon nitride layer (again, not shown) has a thickness thicker than half of the first interval d1 and thinner than half of the second interval d2. After the silicon nitride layer having the thickness is formed, a gap between the first sidewall 218 of the first preliminary gate structure 211 and the adjacent first preliminary gate structure is fully filled with the silicon nitride layer proximate to the upper surface of the semiconductor substrate 200 so that the underlying semiconductor substrate is no longer exposed. On the contrary, a gap between the second sidewall 220 of the first preliminary gate structure 211 and another adjacent first preliminary gate structure proximate to the upper surface of the semiconductor substrate 200 is not fully filled with the silicon nitride layer so that a portion of the semiconductor substrate 200 remain exposed.

In other words, when the silicon nitride layer is anisotropically etched to form the spacers 230, the spacers 230 on the first sidewalls 218 adjacent first and second instances of the first preliminary gate structure 211 make contact with each other so that the underlying semiconductor substrate 200 is no longer exposed, i.e., becomes covered. On the contrary, the spacer 230 on the second sidewall 220 of the first instance of the first preliminary gate structure 211 does not make contact with an opposing spacer 230 positioned against the second sidewall 220 of an adjacent third instance of the preliminary gate structure 211 so that a portion of the semiconductor substrate therebetween is left exposed.

Since the spacers 230 on the first sidewalls 218 of the first and second instances of the first preliminary gate structure 211 make contact with each other, the semiconductor substrate 200 between the first sidewalls 218 of the first and second instances of the first preliminary gate structure 211 is covered with the spacers 230. That is, the linear source region 228 is not exposed.

Impurities are implanted into the semiconductor substrate 200 in the second and third regions but not in the first region so as to form a heavily doped drain region 226a.

In addition, before forming the heavily doped drain region 226a, the semiconductor substrate 200 in the first region may be covered with a photoresist pattern as an ion implantation mask.

As described above, the spacers 230 substantially reduce (if not prevent), silicidation processes from being performed on the sidewalls of the gate structures. Further, the spacers 230 define the heavily doped source/drain regions of the MOS transistor in the second and third regions.

After the above-mentioned processes are completed, the first preliminary gate structure 211, (e.g., included in a unit cell of an NOR flash memory device) is formed in the first region. Further, the second gate structure 225 included in the MOS transistor in which a metal silicide layer pattern is not formed in the second region. Furthermore, the third preliminary gate structure 227 included in the high voltage MOS transistor is formed in the third region.

Figure 13:
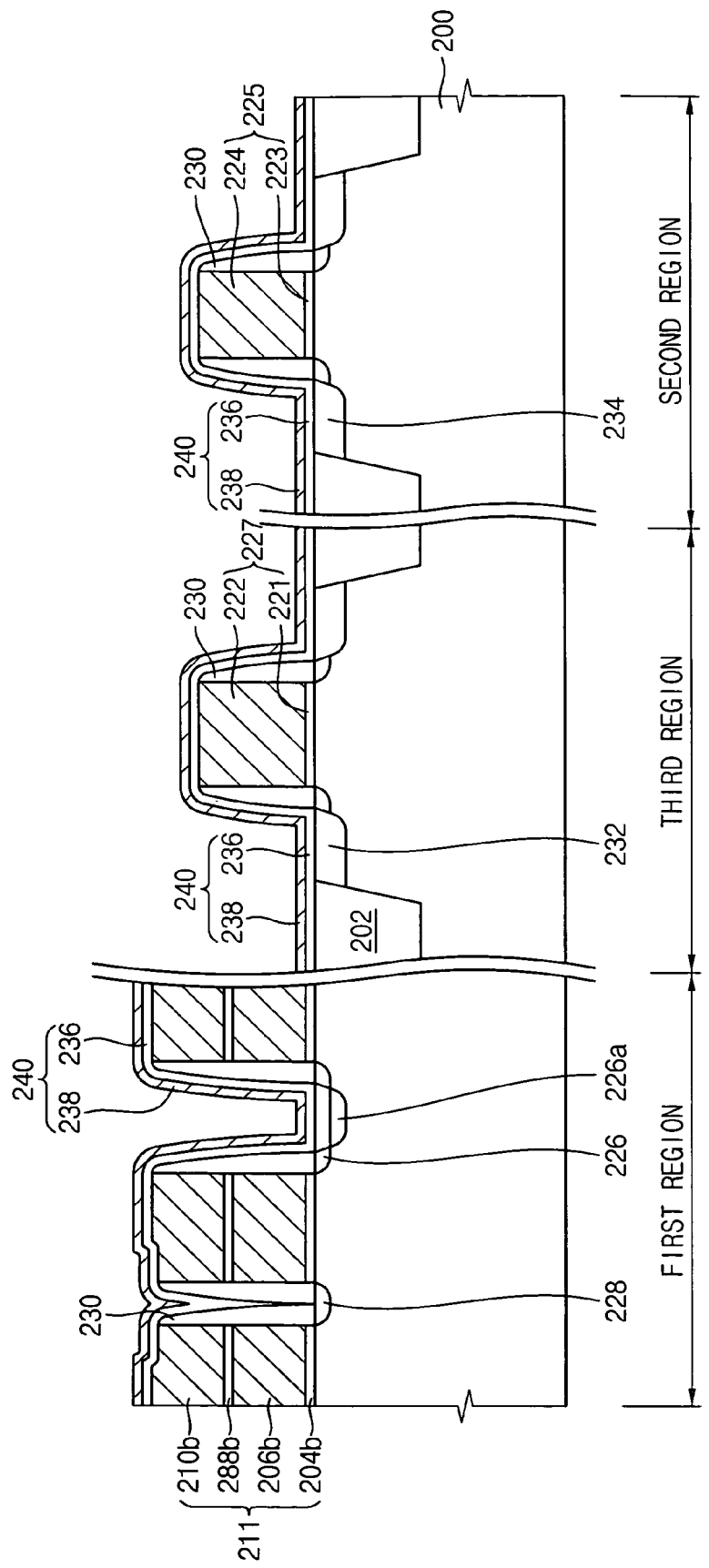

Referring to FIG. 13, a silicidation-blocking layer 240 is formed on the first preliminary gate structure 211, the second gate structure 225, the third preliminary gate structure 227 and the semiconductor substrate 200. The silicidation-blocking layer 240, e.g., includes a silicon oxide layer 236 and a silicon nitride layer 238 sequentially formed.

Figure 14:
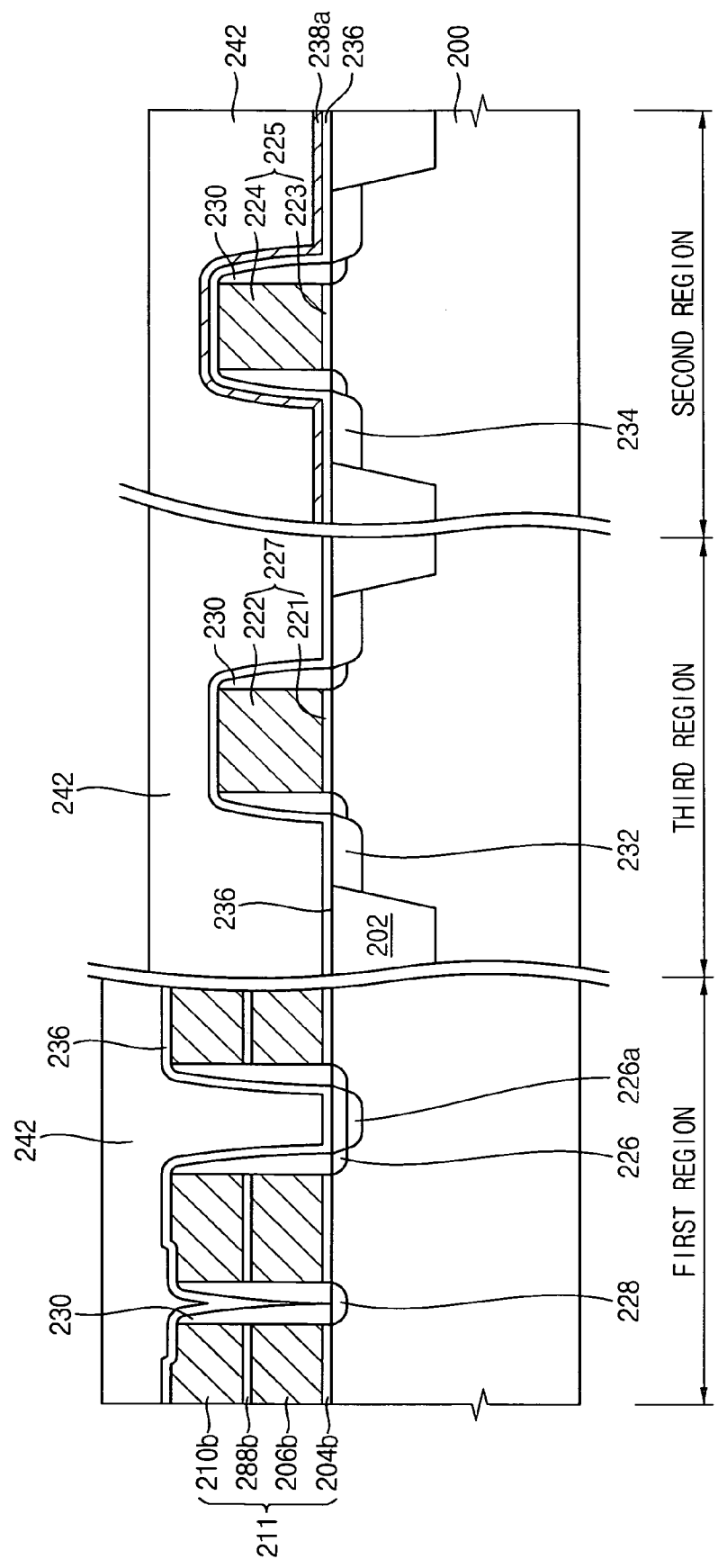

Referring to FIG. 14, the silicon nitride layer 238 in the first and third regions is patterned by a photolithography process to form a silicon nitride layer pattern 238a on the semiconductor substrate 200 in the second region and the second gate structure 225.

A second photoresist film 242 is then formed on the semiconductor substrate 200 having the silicon oxide layer 236 and the silicon nitride layer pattern 238a. Here, the first preliminary gate structures 211 are relatively densely arranged in the first region. On the contrary, the second preliminary gate structures 225 and the third preliminary gate structures 227 are relatively coarsely arranged in the second and third regions, respectively.

In addition, the first preliminary gate structures 211 are taller than second and third preliminary structures 225 and 227, respectively. As a result, as shown in FIG. 14, the second photoresist film 242 has a stepped portion.

Figure 15:
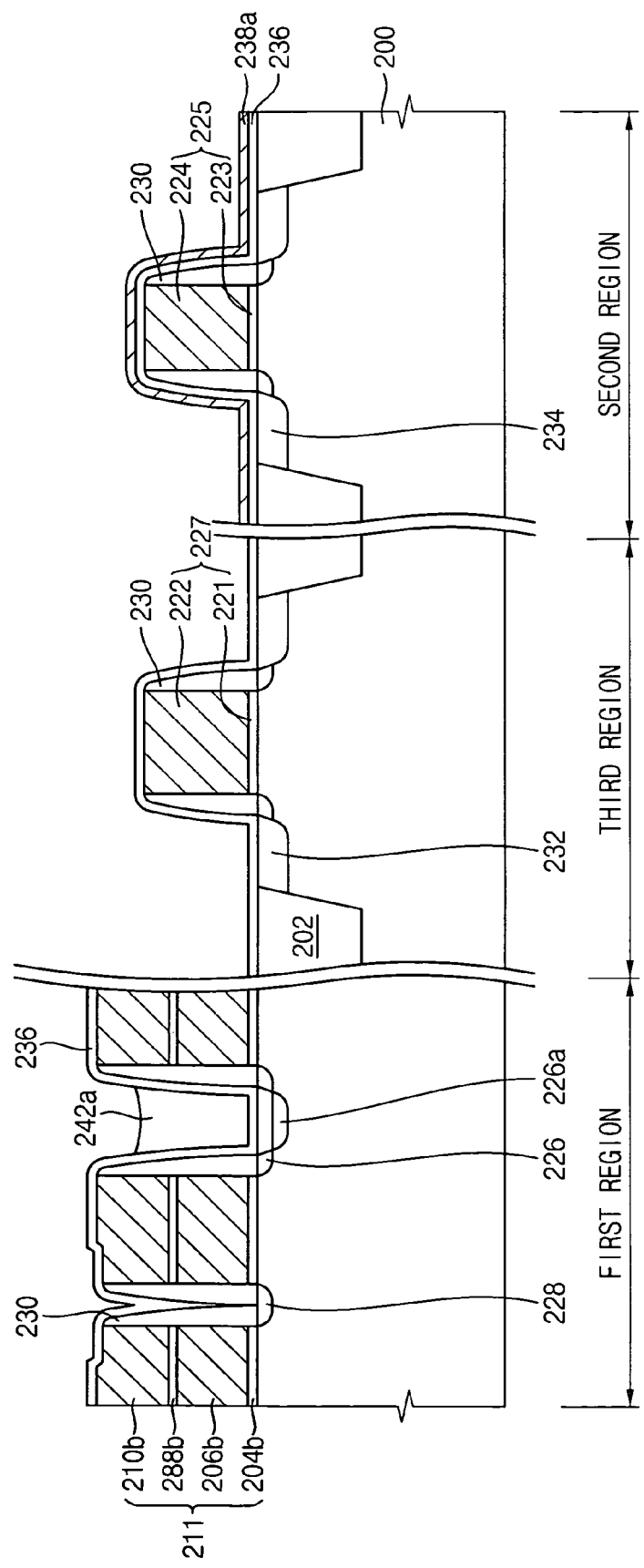

Referring to FIG. 15, the second photoresist film 242 is blank-exposed. Here, the blank-exposing process is carried out under conditions that a portion of the second photoresist film 242 in the gap located between the second sidewalls 220 of the first and second instances of the first preliminary gate structures 211 is not sufficiently exposed, whereas the portions of the second photoresist film 242 in the second and third regions and elsewhere in the first region are sufficiently exposed. As a result, after the exposed second photoresist film 242 is developed, a remainder exists in the form of a second photoresist pattern 242a that selectively masks the gap between the second sidewalls 220 of the first preliminary gate structures 211. Generally, the second photoresist pattern 242a is referred to as a photoresist plug.

Figure 16:
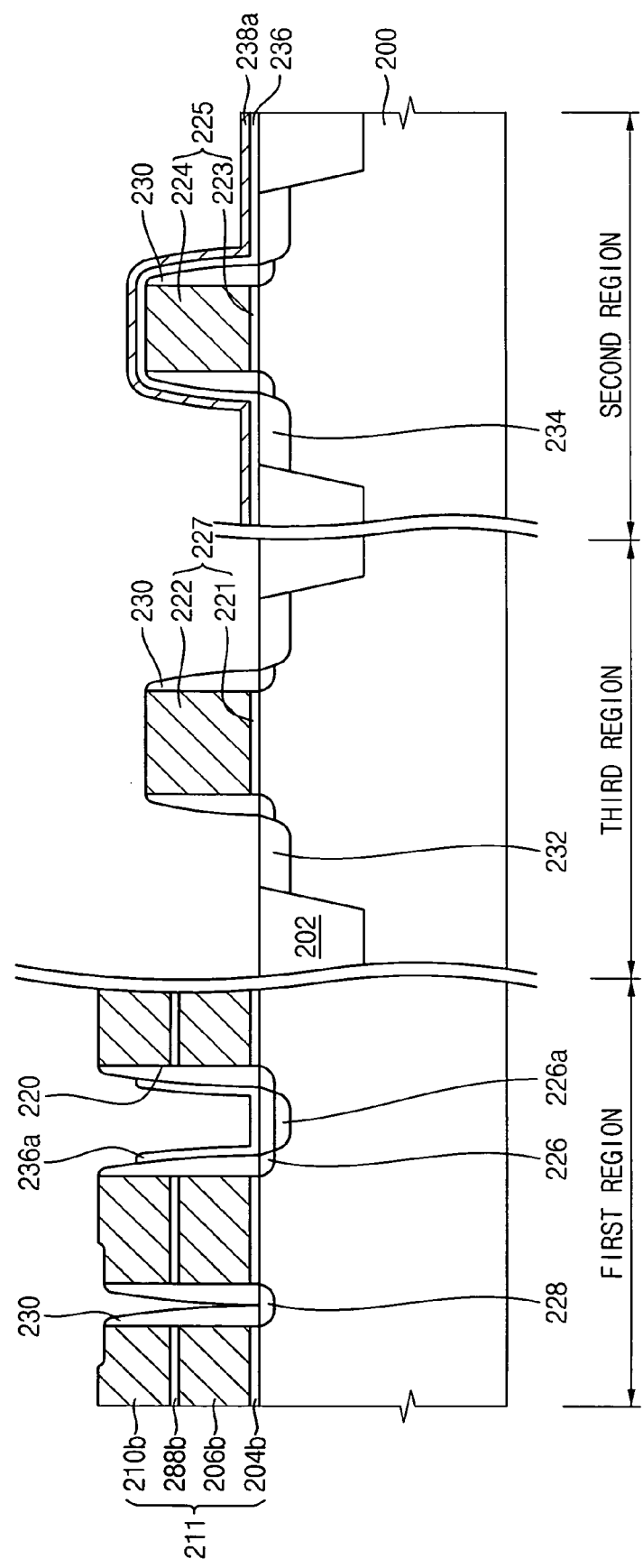

Referring to FIG. 16, the silicon oxide layer 236 is etched using the second photoresist pattern 242a as an etching mask to form a silicon oxide layer pattern 236a on the semiconductor substrate 200 and on the spacers 230 in the region between the second sidewalls 220 of the first and second instances of the first preliminary gate structure 211. Here, since the silicon nitride layer pattern 238a is not etched by the process for etching the silicon oxide layer 236, the silicon nitride layer pattern 238a still remains.

The second photoresist pattern 242a is removed, e.g., by an ashing process and/or a stripping process. Here, the silicon oxide layer pattern 236a may be partially removed in removing the second photoresist pattern 242a so that a thickness of the silicon oxide layer pattern 236a is reduced. Without being bound by theory, the silicon oxide layer pattern 236a functions to control a silicidation reaction of the semiconductor substrate 200 located between the first and third instances of the first preliminary gate structures 211.

That is, when the silicon oxide layer pattern 236a is relatively thick, the silicidation reaction may not be generated at the semiconductor substrate 200 located between the first and third instances of the first preliminary gate structures 211. As a result, a second metal silicide layer pattern is not formed on the drain region 226 of the cell transistor.

On the contrary, when the silicon oxide layer pattern 236a is sufficiently thin for allowing the silicidation reaction, the second metal silicide layer pattern (which is thinner than that of a first metal silicide layer pattern in a control gate structure of the cell transistor) is formed on the drain region 226 of the cell transistor. To be sufficiently to allow the silicidation reaction on the drain region 226 of the cell transistor to occur readily, the silicon oxide layer pattern 236a may have a thickness of, e.g., about 20 Å to about 1000 Å.

Figure 17:
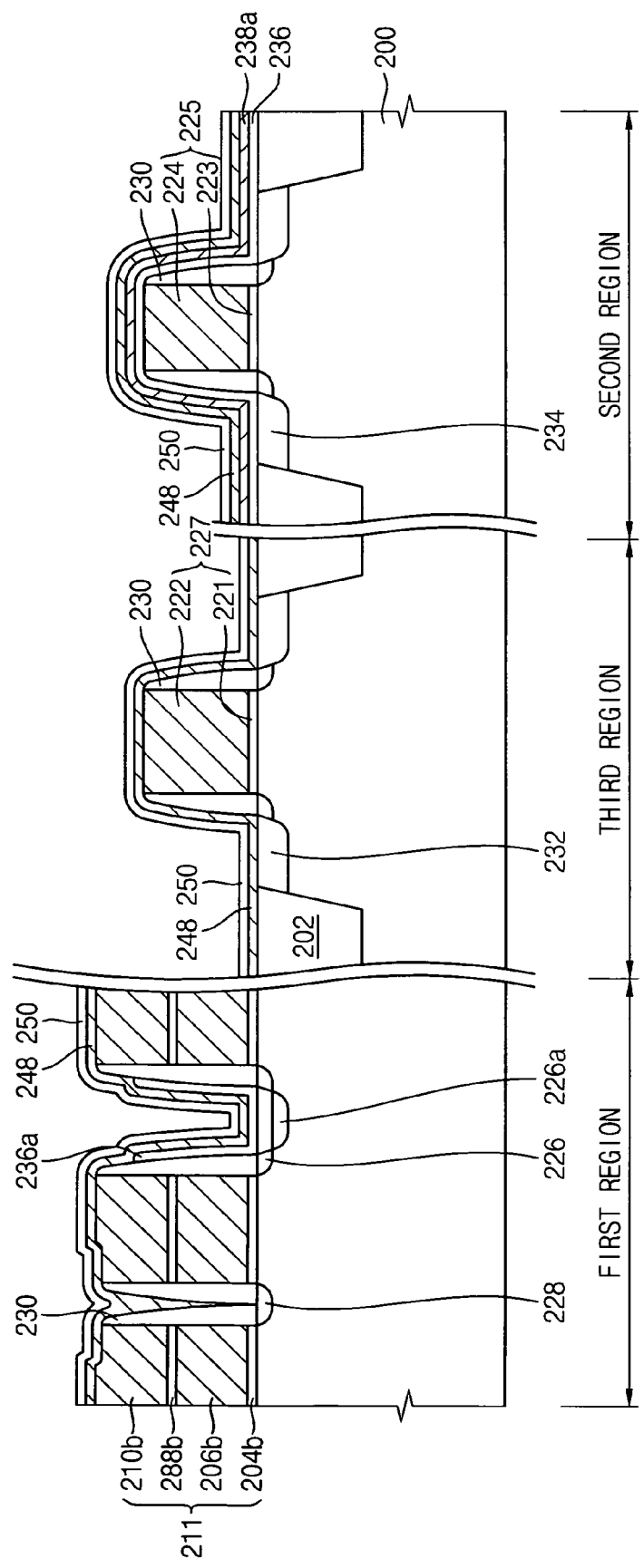

Referring to FIG. 17, a metal layer 248 is formed on the first preliminary gate structure 211, the silicon oxide layer pattern 236a, the spacers 230, the third preliminary gate structure 227 and the silicon nitride layer pattern 238a. An example of the metal layer 248 includes, e.g., a cobalt layer formed, e.g., by a PVD process, a CVD process, etc.

A capping layer 250, e.g., a titanium nitride layer, is formed on the metal layer 248. The titanium nitride layer 240 functions as to prevent heat generated in a following thermal treatment process for the silicidation reaction from being directly transmitted into the metal layer 248. Thus, a metal silicide layer having a good resistance characteristic may be obtained. Further, the titanium nitride layer 250 is reacted with the silicon oxide layer pattern 236a between the semiconductor substrate 200 including silicon and the metal layer 248. Thus, although the silicon oxide layer pattern 236a between the semiconductor substrate 200 and the metal layer 248 is relatively thin, the silicidation reaction between the semiconductor substrate 200 and the metal layer 248 may sufficiently occur.

Figure 18:
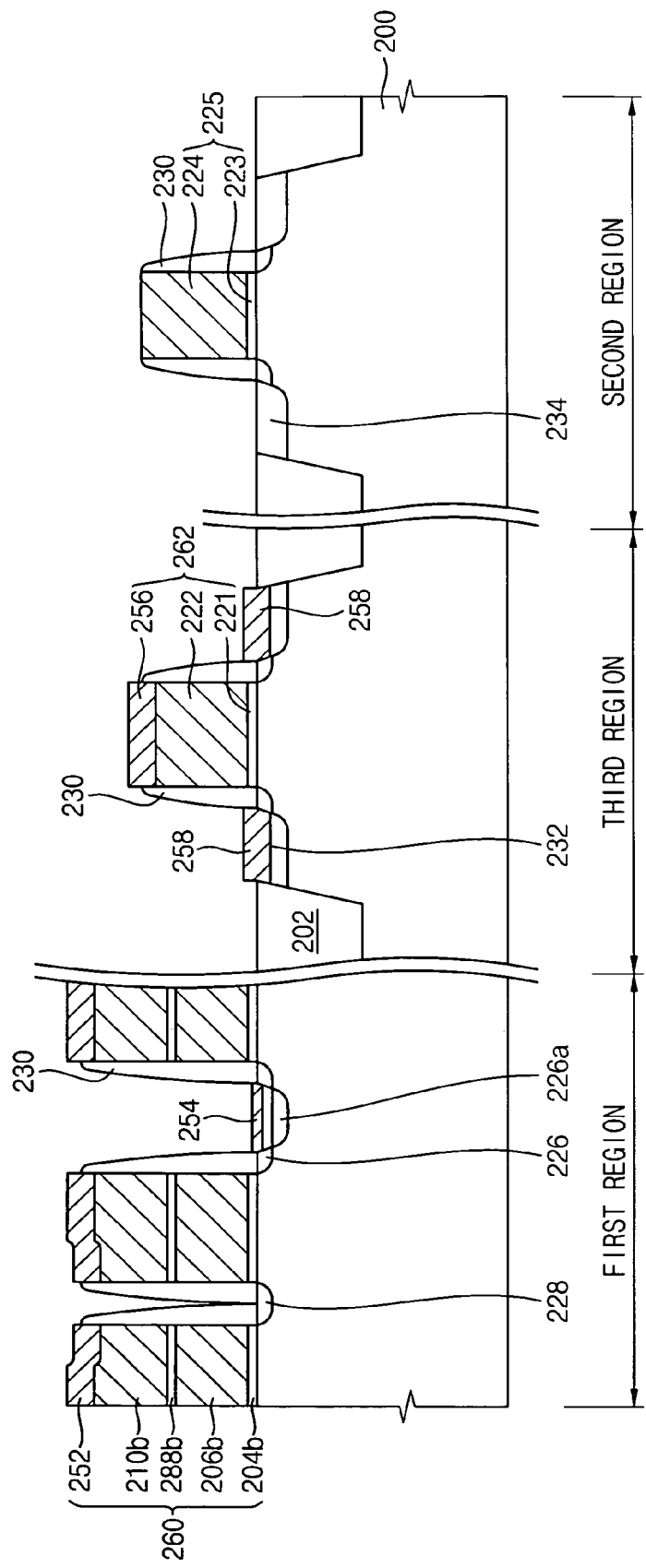

Referring to FIG. 18, the metal layer 248 is thermally treated to form a first metal silicide layer pattern 252 on the first preliminary gate structure 211, a second metal silicide layer pattern 254 on a portion of the semiconductor substrate 200 located between the second sidewalls 220 of the first and third instances of the first preliminary gate structures 211, a third metal silicide layer pattern 256 on the third preliminary gate structure 227, and a fourth metal silicide layer pattern 258 on the semiconductor substrate 200 at both sides of the third preliminary gate structure 227. Simultaneously, the first preliminary gate structure 211 and the third preliminary gate structure 227 are converted into a first gate structure 260 including the first metal silicide layer pattern 252 and a third gate structure 262, respectively.

Hereinafter, the thermal treatment will be explained in detail.

When the semiconductor substrate 200 is primarily thermally treated, a metal in the metal layer 248 is reacted with polysilicon in the semiconductor substrate 200, the first preliminary gate structure 211 and the third preliminary gate structure 227 to form preliminary metal silicide layers (not shown) on the semiconductor substrate 200, the first preliminary gate structure 211 and the third preliminary gate structure 227. According to this example embodiment (namely, the example method some of whose stages are depicted in FIGS. 9-18), when cobalt is used for the metal layer 248, the primary thermal treatment may include, e.g., a rapid thermal process (RTP) that is carried out at a temperature of, e.g., about 400° C. to about 500° C. After completing the primary thermal treatment, the cobalt is reacted with the silicon to form CoSi.

The preliminary metal silicide layer is secondarily thermally treated at a temperature higher than that of the primary thermal treatment to convert the preliminary metal silicide layer into a metal silicide material having a stable phase and a low resistance. The secondary thermal treatment may include an, e.g., RTP that is carried out at a temperature of, e.g., about 600° C. to about 900° C. After completing the secondary thermal treatment, the CoSi is converted into $CoSi_2$ having the stable phase and the low resistance.

Here, the silicidation reaction does not occur at a region where the spacers 230 and the silicon nitride layer pattern 238a are formed. Thus, at least substantial if not complete prevention of the formation of a metal silicide layer on the second gate structure 225 is achieved.

Further, since the silicon oxide layer pattern 236a is formed on a portion of the semiconductor substrate 200 located between the second sidewalls 220 of the first and third instances of the first preliminary gate structures 211, the silicidation reaction is at least retarded if not prevented so that the second metal silicide layer pattern 254 is thinner than the first metal silicide layer pattern 252.

When the above-mentioned processes are completed, the first gate structure 260 having the uppermost first metal silicide layer pattern 252 is formed. Further, the second metal silicide layer pattern 254 (having the thickness thinner than that of the first metal silicide layer pattern 252) is formed on the drain region 226 between the first gate structures 260.

A non-reacted metal layer 248 and the capping layer 250 are then removed. A bit line (not shown) is electrically connected to the drain region 226 of the first transistor.

According to this example embodiment (namely, the example method some of whose stages are depicted in FIGS. 9-18), the thickness of the silicon oxide layer pattern on the semiconductor substrate between the first gate structures that is used, e.g., for the cell of the non-volatile memory device, is controlled so that different thicknesses of the first metal silicide layer pattern on the first gate structure and the second metal silicide layer pattern on the drain region may be obtained.

Further, when the transistor corresponds, e.g., to a high voltage transistor, the metal silicide layer pattern having a sufficiently thick thickness may be formed on the gate electrode and the source/drain regions.

FIGS. 19 to 23 are cross sectional views illustrating some stages (most of which are intermediary) of a method, according to an example embodiment of the present invention, for manufacturing a semiconductor device.

Figure 19:
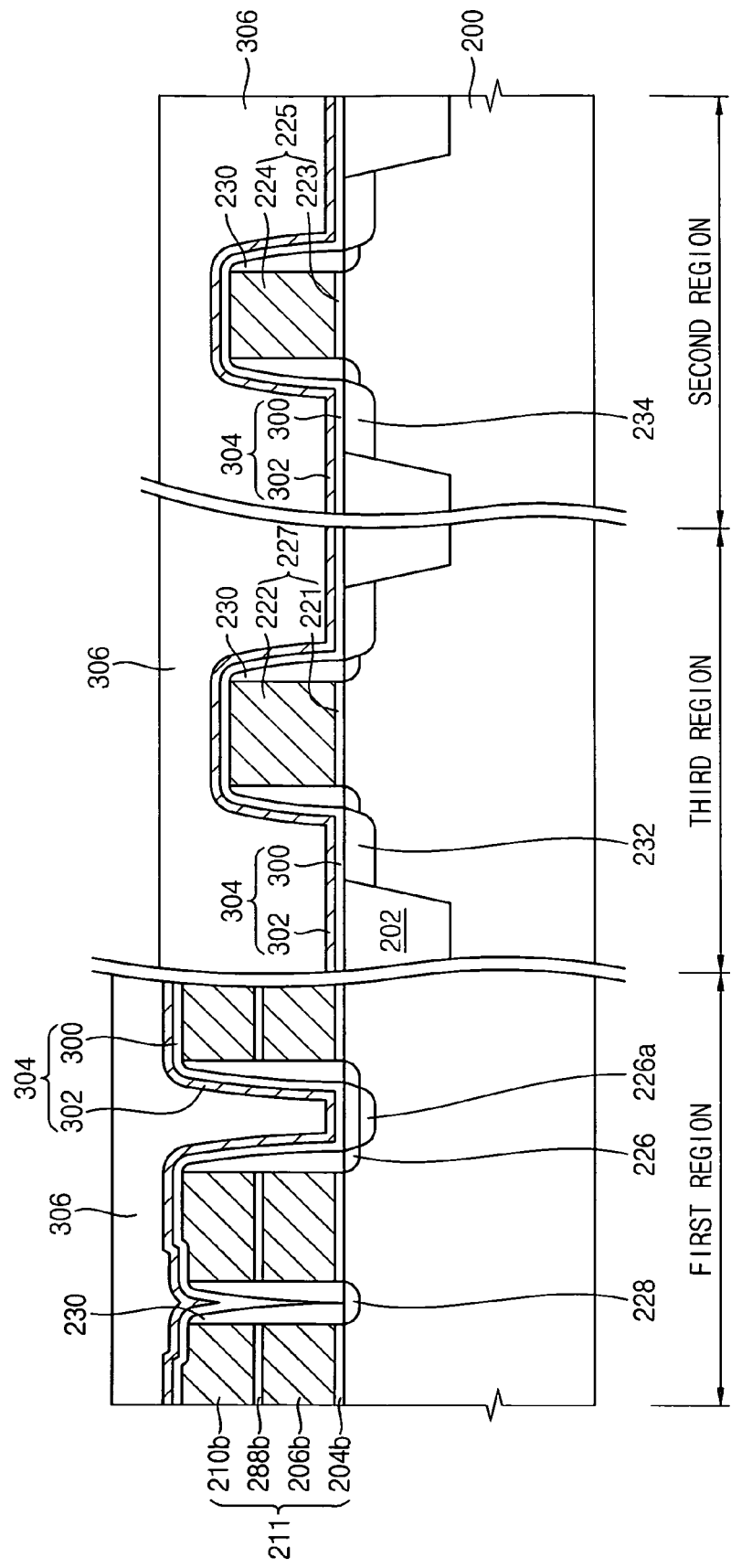
FIGS. 19 to 23 are cross sectional views illustrating some stages (most of which are intermediary) of a method, according to an example embodiment of the present invention, for manufacturing a semiconductor device itself in accordance with an example embodiment of the present invention; and, FIGS. 24 to 26 are cross sectional views illustrating some stages (most of which are intermediary) of a method, according to an example embodiment of the present invention, for manufacturing a semiconductor device itself in accordance with an example embodiment of the present invention.

Referring to FIG. 19, processes can be carried out in the same manner as is described relative to FIGS. 9 to 12 to form a structure substantially similar to that in FIG. 12. That is, the first preliminary gate structure 211, the second gate structure 225 and the third preliminary gate structure 227 are formed on the semiconductor substrate 200.

A silicidation-blocking layer 304 is formed on the first preliminary gate structure 211, the second gate structure 225, the third preliminary gate structure 227 and the semiconductor substrate 200. The silicidation-blocking layer 304 includes, e.g., a silicon oxide layer 300 and a silicon nitride layer 302 sequentially formed.

A photoresist film 306 is then formed on the silicidation-blocking layer 304. Here, the first preliminary gate structures 211 are relatively densely arranged in the first region. In contrast, the second gate structures 225 and the third preliminary gate structures 227 are relatively coarsely arranged in the second and third regions, respectively.

In addition, the first preliminary gate structures 211 are taller than the second and third preliminary gate structures 225 and 227, respectively. As a result, as shown in FIG. 19, the photoresist film 306 has a stepped portion.

Figure 20:
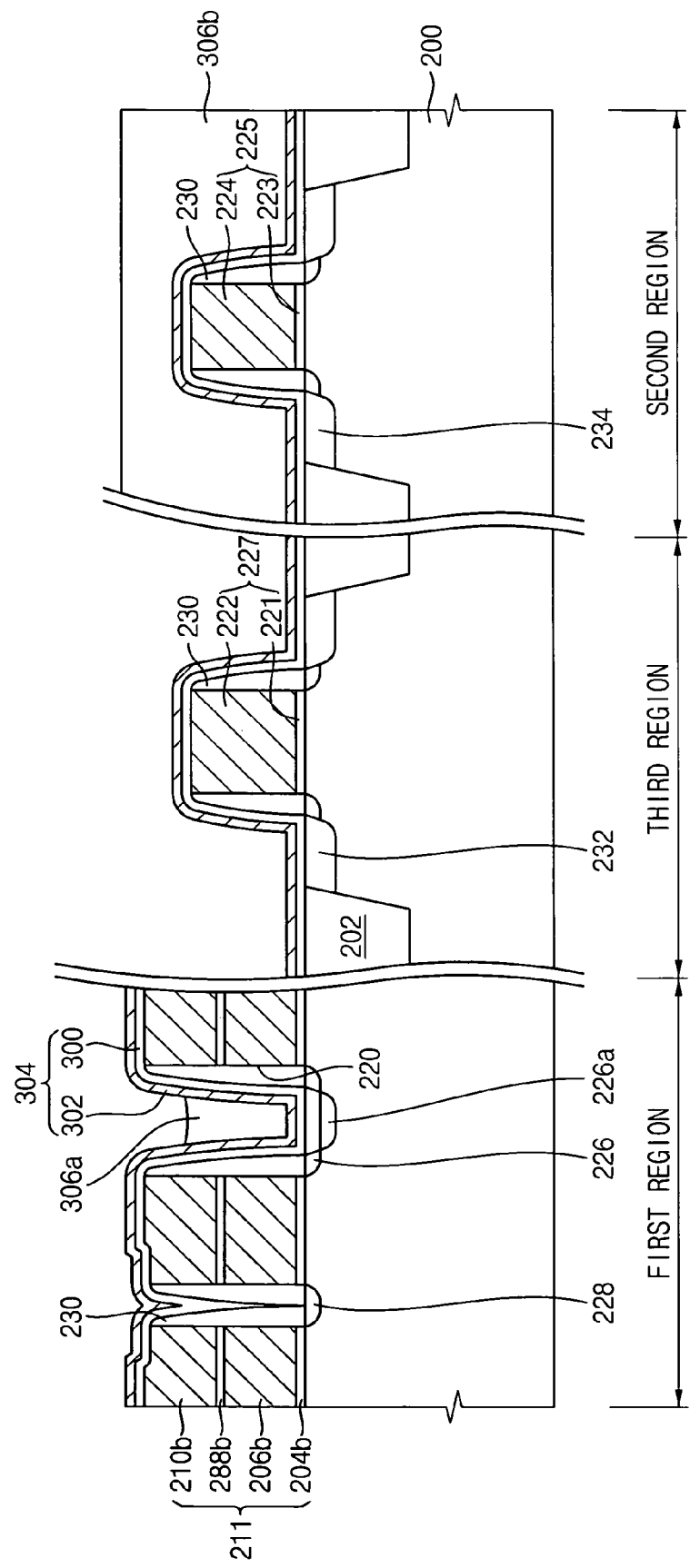

Referring to FIG. 20, the photoresist film 306 is, e.g., exposed using a reticle for entirely exposing the first and third regions and selectively exposing the second region. Here, the exposing process is carried out under conditions that the photoresist film 306 over the gap between the second sidewalls 220 of the first preliminary gate structures 211 is not sufficiently exposed, and the photoresist film 306 in the second and third regions and the other portions of the first region is sufficiently exposed.

The exposed second photoresist film 306 is developed so as to form a first photoresist pattern 306a selectively masking the gap between the second sidewalls 220 of the first preliminary gate structures 211 and a second photoresist pattern 306b selectively masking the second region. Generally, the first photoresist pattern 306a is referred to as a photoresist plug.

Figure 21:
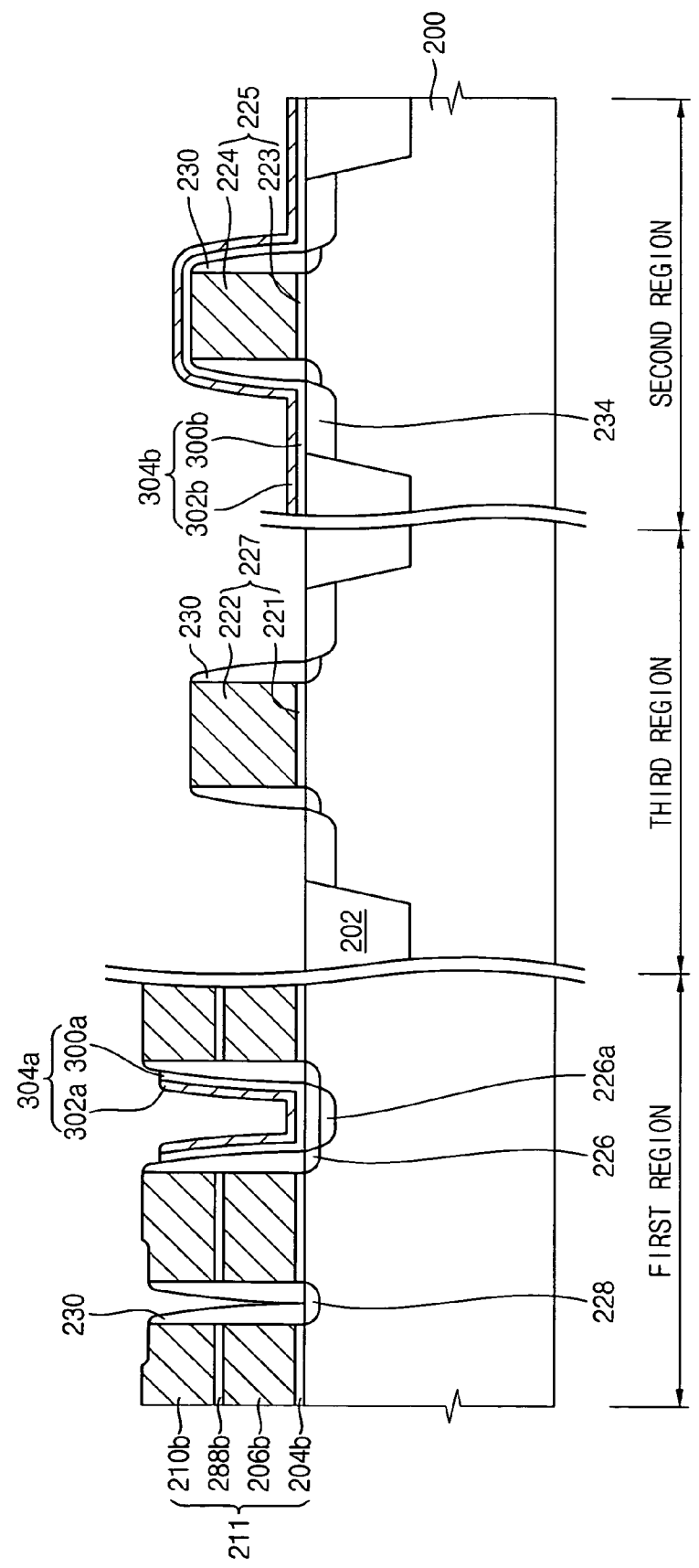

Referring to FIG. 21, the silicidation-blocking layer 304 is etched using the first and second photoresist patterns 306a and 306b as an etching mask to form a first silicidation-blocking layer pattern 304a on the semiconductor substrate 200 and the spacers 230 between the second faces 220 of the first preliminary gate structures 211, and a second silicidation-blocking layer pattern 304b on the semiconductor substrate 200, the spacers 230 and the second gate structure 205 in the second region. Here, the first silicidation-blocking layer pattern 304a includes a first silicon oxide layer pattern 300a and a first silicon nitride layer pattern 302a. Further, the second silicidation-blocking layer pattern 304b includes a second silicon oxide layer pattern 300b and a second silicon nitride layer pattern 302b.

The first and second photoresist patterns 306a and 306b are removed, e.g., by an ashing process and/or a stripping process.

Then, a metal layer (not shown) is formed on the first preliminary gate structure 211, the first silicidation-blocking layer pattern 304a, the spacers 230, the third preliminary gate structure 227 and the second silicidation-blocking layer pattern 304b. An example of the metal layer includes a cobalt layer formed, e.g., by a PVD process, a CVD process, etc. A capping layer (not shown), e.g., a titanium nitride layer, as a capping layer is then formed on the metal layer.

Figure 22:
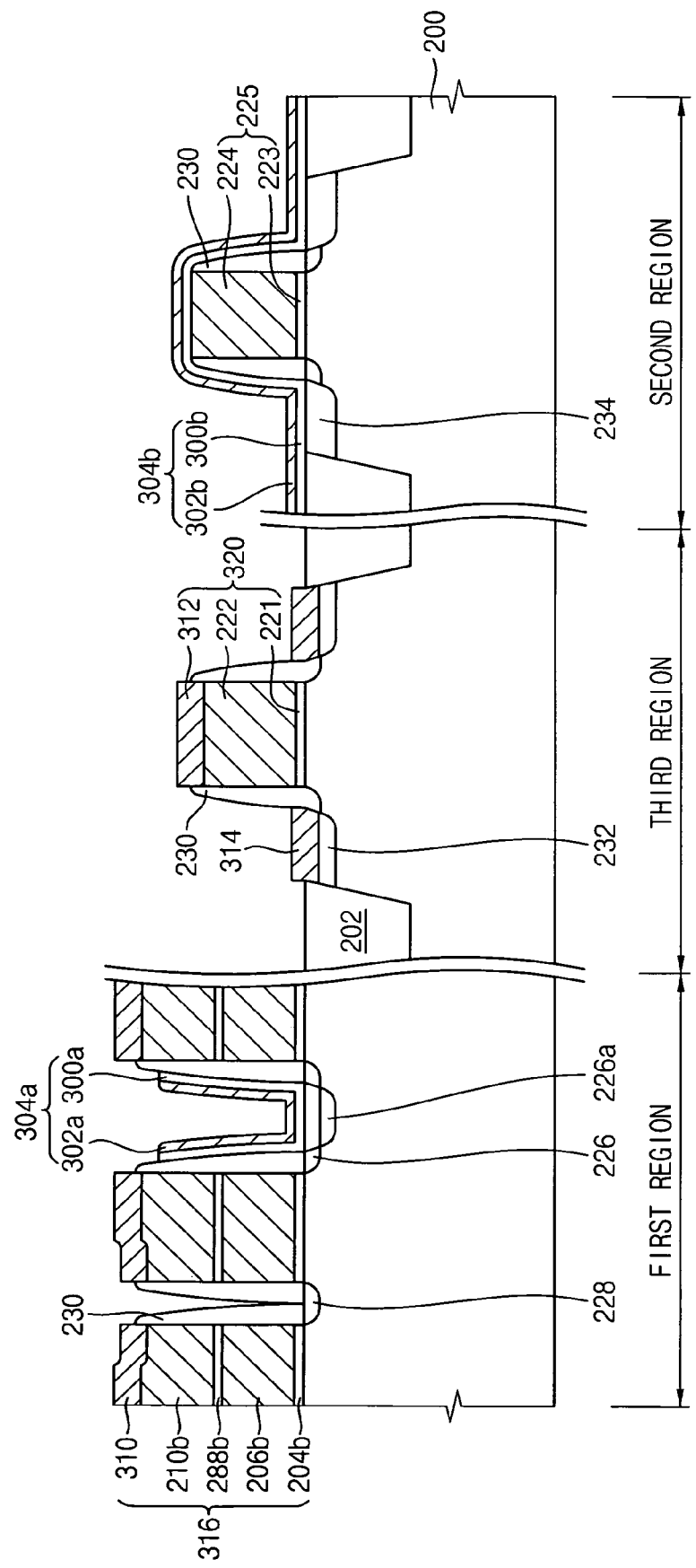

Referring to FIG. 22, the metal layer is thermally treated to form a first metal silicide layer pattern 310 on the first preliminary gate structure 211, a second metal silicide layer pattern 312 on the third preliminary gate structure 227, and a third metal silicide layer pattern 314 on the semiconductor substrate 200 at both sides of the third preliminary gate structure 227. Simultaneously, the first preliminary gate structure 211 and the third preliminary gate structure 227 are converted into a first gate structure 316 including the first metal silicide layer pattern 310 and a third gate structure 320 including the second metal silicide layer pattern 312, respectively.

Figure 23:
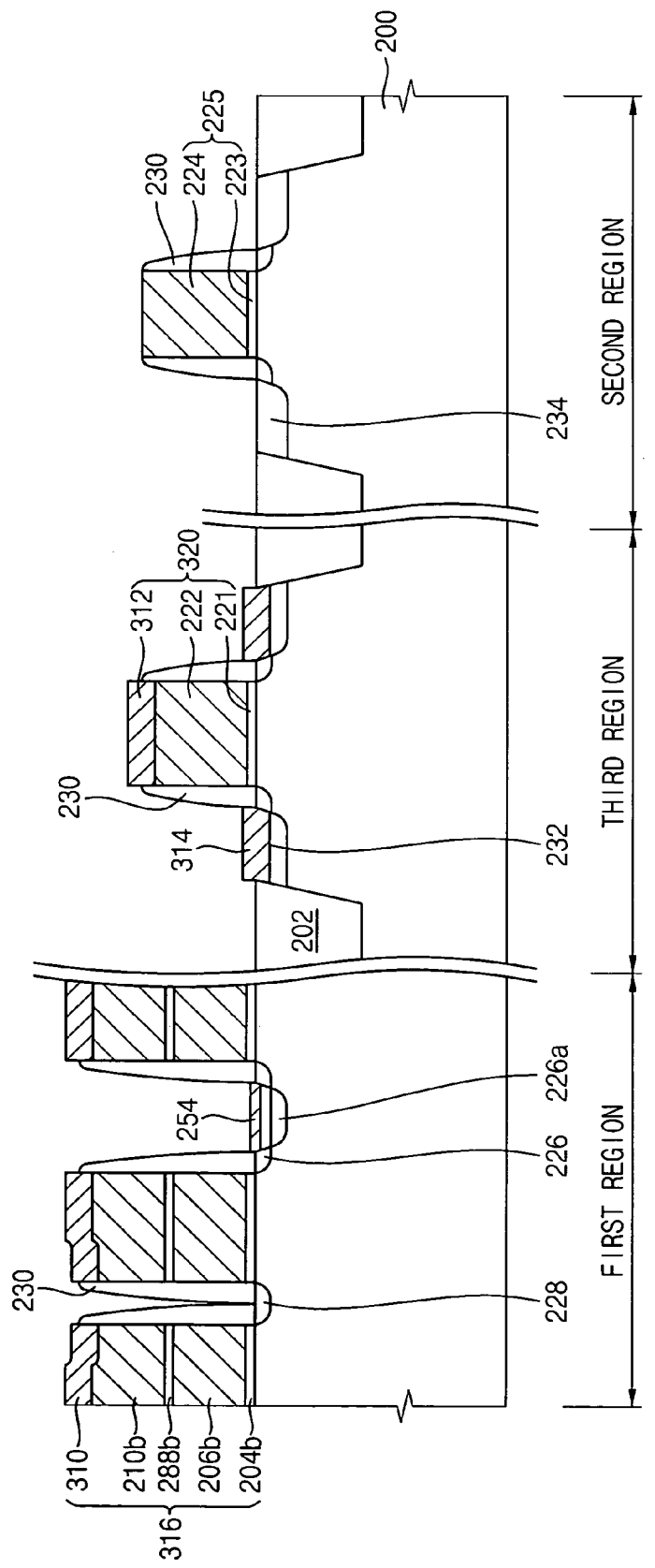

Referring to FIG. 23, a non-reacted metal layer and the capping layer are then removed. A bit line (not shown) is electrically connected to the drain region 226 of the first transistor in the first region.

According to this example embodiment (namely according to the example method some of whose stages are depicted in FIGS. 19-23), the metal silicide layer pattern may be selectively formed on a portion for a control gate structure, though it may be at least substantially retarded if not prevented from being formed on the drain region of the first transistor that is used, e.g., for the cell of the non-volatile memory device.

Further, when the transistor corresponds to, e.g., a high voltage transistor, the metal silicide layer pattern having a sufficiently thick thickness may be formed on the gate electrode and the source/drain regions.

Figure 24:
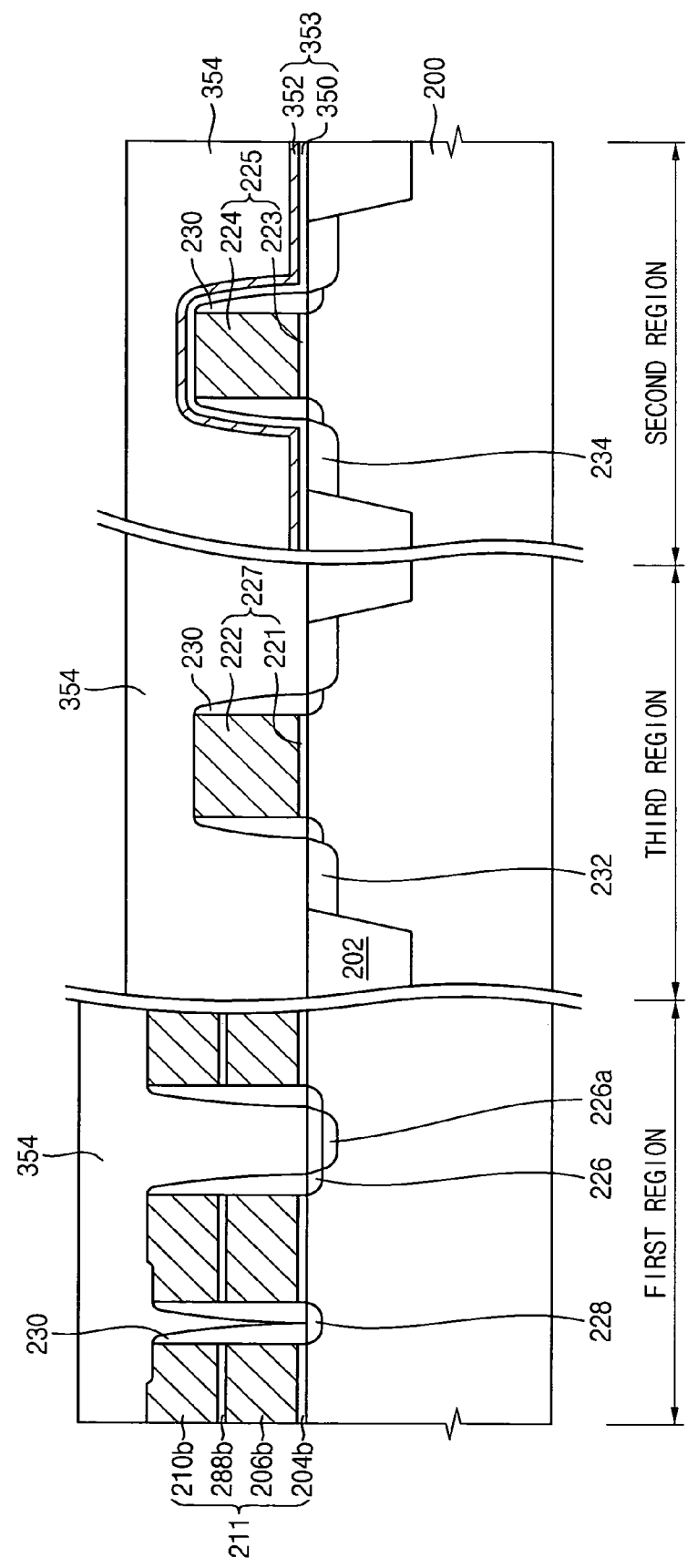
Figure 25:
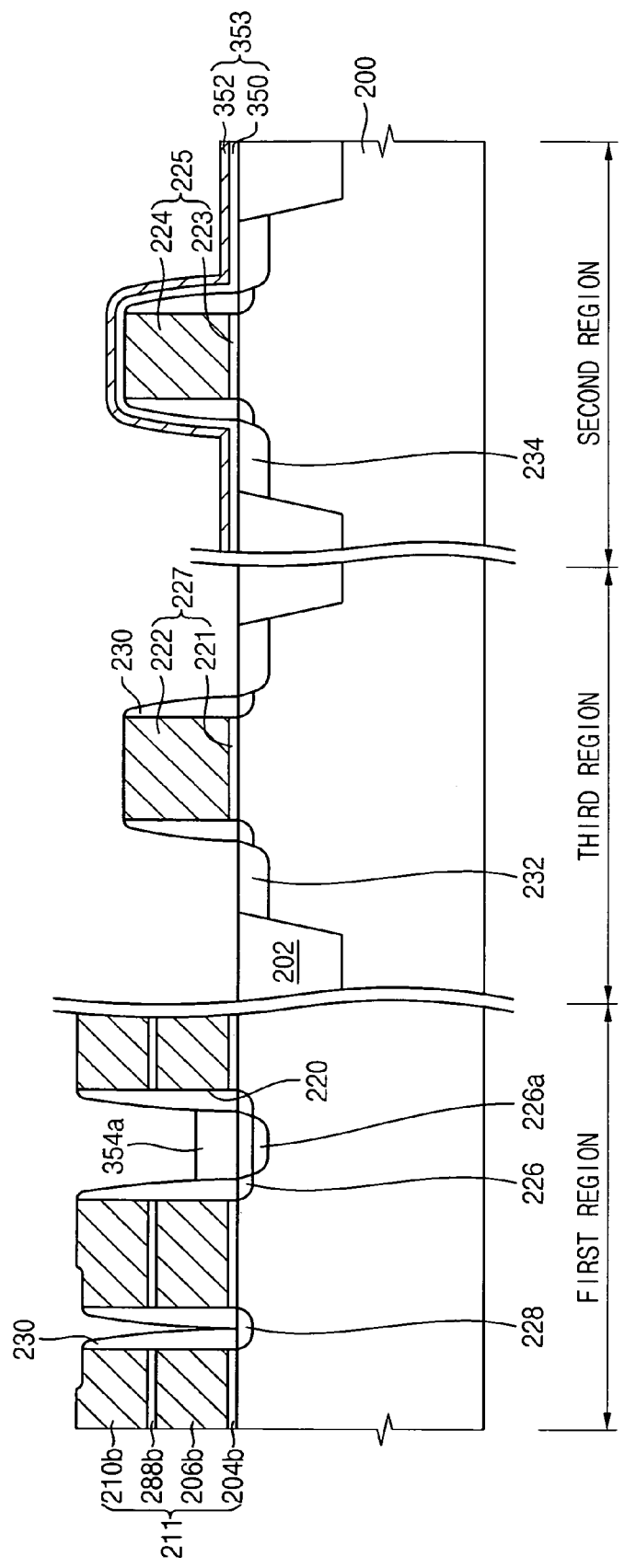
Figure 26:
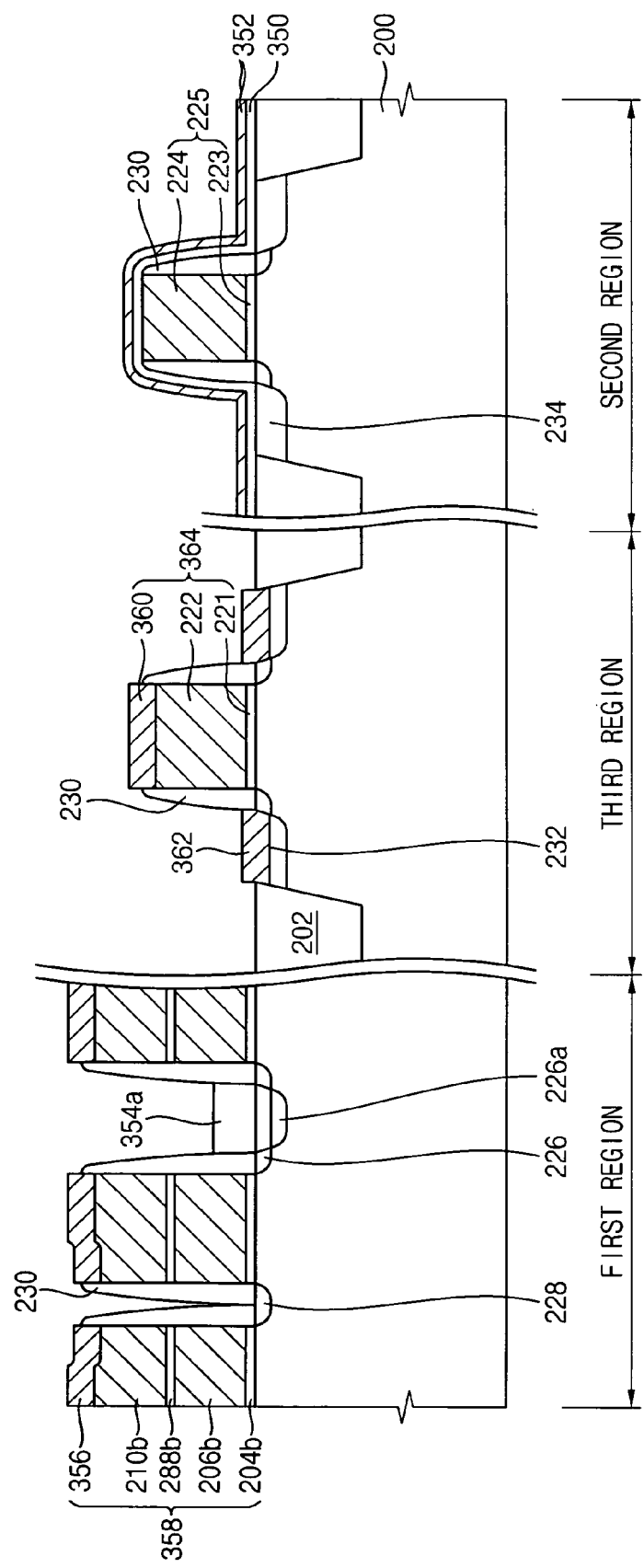

FIGS. 24 to 26 are cross sectional views illustrating some stages (most of which are intermediary) of a method, according to an example embodiment of the present invention, for manufacturing a semiconductor device.

Referring to FIG. 24, processes can be carried out in the same manner as is described relative to FIGS. 9 to 12 to form a structure substantially similar to that in FIG. 12. That is, the first preliminary gate structure 211, the second gate structure 225 and the third preliminary gate structure 227 are formed on the semiconductor substrate 200.

A silicidation-blocking layer (not shown) is formed on the first preliminary gate structure 211, the second gate structure 225, the third preliminary gate structure 227 and the semiconductor substrate 200. The silicidation-blocking layer includes, e.g., a silicon oxide layer (not shown) and a silicon nitride layer (not shown) sequentially formed.

The silicidation-blocking layer is etched to form a silicidation-blocking layer pattern 353 in the second region, leaving exposed the first and third preliminary gate structures 211 and 225, the spacers 230 and portions of the semiconductor substrate 200; here, the overall intermediate hereafter is referred to as the intermediate configuration. Here, the silicidation-blocking layer pattern 353 includes a silicon oxide layer pattern 350 and a silicon nitride layer pattern 352.

An oxide layer 354, e.g., a fluidic oxide layer, is formed on the semiconductor intermediate configuration.

To form the fluidic oxide layer 354, a fluidic oxide material including silicon atoms is deposited on the intermediate configuration. The fluidic oxide material is annealed to harden the fluidic oxide material, thereby forming the fluidic oxide layer 354. For reasons similar to those given in the discussion of FIG. 19, the fluidic oxide layer 354 has a stepped portion as shown in FIG. 24.

Referring to FIG. 25, the fluidic oxide layer 354 is etched-back to at least substantially if not completely remove the fluidic oxide layer 354 on the first preliminary gate structure 211 and on the second and third regions, though a portion of the fluidic oxide layer 354 can remain in the gap between the second sidewalls 220 of the first preliminary gate structures 211.

Here, after completing the etch-back process, there remains a portion of the fluidic oxide layer 354, namely fluidic oxide layer pattern 354a, in the gap between the second sidewalls 220 of the first preliminary gate structures 211. Simultaneously, the silicidation-blocking layer pattern 353 in the second region is exposed.

Referring to FIG. 26, a metal layer (not shown) is formed on the first preliminary gate structure 211, the fluidic oxide layer pattern 354a, the spacers 230, the third preliminary gate structure 227 and the silicon nitride layer pattern 352. A capping layer (not shown), e.g., a titanium nitride layer, is then formed on the metal layer.

The metal layer is thermally treated to form a first metal silicide layer pattern 356 on the first preliminary gate structure 211, a second metal silicide layer pattern 360 on the third preliminary gate structure 227, and a third metal silicide layer pattern 362 on the semiconductor substrate 200 at both sides of the third preliminary gate structure 227. Simultaneously, the first preliminary gate structure 211 and the third preliminary gate structure 227 are converted into a first gate structure 358 including the first metal silicide layer pattern 356 and a third gate structure 364 including the second metal silicide layer pattern 360, respectively.

A non-reacted metal layer and the capping layer are then removed. Then, the silicidation-blocking layer pattern 352 is removed.

A bit line (not shown) is electrically connected to the drain region 226 of the cell transistor in the first region.

According to at least one embodiment of the present invention, formation of the metal silicide layer pattern on the gate structure and the impurity regions may be controlled to achieve different thicknesses thereof. Thus, suitable transistors having different characteristics that are required in each of various regions of a semiconductor device may be formed. Such a semiconductor device may have improved operational characteristics.

With some embodiments of the present invention having thus been described, it will be obvious that the same may be varied in many ways. Such variations are not to be regarded as a departure from the spirit and scope of the present invention, and all such modifications are intended to be included within the scope of the present invention.

What is claimed is:

1. A method of manufacturing one or more regions of a semiconductor device, the method comprising:
    forming a preliminary gate structure including an uppermost polysilicon layer pattern on a substrate;
    forming impurity regions in the substrate at both sides of the preliminary gate structure;
    forming spacers against sidewalls of the preliminary gate structure;
    forming a silicon oxide layer pattern having a thickness sufficiently thin so that a subsequent silicidation reaction occurs on a portion of the substrate next to the spacers;
    forming a metal layer on the preliminary gate structure, the silicon oxide layer pattern and the spacers; and
    reacting the metal layer with the preliminary gate structure and the substrate underneath the silicon oxide layer pattern to form a gate structure and a second silicide layer pattern on the impurity regions, respectively, the gate structure including an uppermost first metal silicide layer pattern having a first thickness, and the second silicide layer pattern having a second thickness thinner than the first thickness.

2. The method of claim 1, wherein the metal layer includes a cobalt layer.

3. The method of claim 1, further comprising forming a capping layer on the metal layer.

4. The method of claim 1, wherein:
    the step of forming a preliminary gate structure forms a plurality of such structures; and a first gap between a first type of sidewall of adjacent first and second instances of a gate structure is narrower than a second gap between a second type of sidewall of the first instance of the gate structure opposite to the first sidewall thereof and the second type of sidewall of a third instance of the gate structure adjacent to the first instance of the gate structure, and a first one of the spacers that is against the first type of sidewall of the first instance of the gate structure makes contact with a second one of the spacers that is against the first type of sidewall of the adjacent second instance of the gate structure.

5. The method of claim 1, wherein the step of forming the silicon oxide layer pattern includes:
   forming a silicon oxide layer on the gate structure, the spacers and the substrate;
   forming a photoresist film on the silicon oxide layer;
   blank-exposing the photoresist film to form a photoresist pattern selectively masking the substrate between the gate structures;
   etching the silicon oxide layer using the photoresist pattern as an etching mask to form the silicon oxide layer pattern; and
   removing the photoresist pattern.

6. The method of claim 1, wherein the silicon oxide layer pattern has a thickness of about 20 Å to about 1,000 Å.

7. The method of claim 1, wherein the step of forming the preliminary gate structure comprises:
   forming a gate oxide layer pattern on the substrate; and
   forming a polysilicon layer pattern on the gate oxide layer pattern.

8. The method of claim 1, wherein step of forming the preliminary gate structure comprises:
   forming a tunnel oxide layer pattern on the substrate;
   forming a first polysilicon layer pattern on the tunnel oxide layer pattern;
   forming a dielectric layer pattern on the first polysilicon layer pattern; and
   forming a second polysilicon layer pattern on the dielectric layer pattern.

9. A method of manufacturing at least first and second regions of a semiconductor device, the method comprising:
   forming a first preliminary gate structure and a second preliminary gate structure including uppermost polysilicon layers, respectively, on first and second regions of a substrate, respectively;
   forming first and second impurity regions in the substrate at each of both sides of the first preliminary gate structure and the second preliminary gate structure;
   forming spacers against sidewalls of the first preliminary gate structure and the second preliminary gate structure;
   forming a first silicidation-controlling layer pattern on the substrate in the first region and a second silicidation-controlling layer pattern on the substrate and on the second preliminary gate structure in the second region, the first silicidation-controlling layer pattern selectively exposing the first preliminary gate structure and having a thickness sufficiently thin so that a subsequent silicidation reaction on the substrate could occur;
   forming a metal layer on the first preliminary gate structure, the silicidation-controlling layer pattern, the spacers and the silicidation-blocking layer pattern; and
   reacting the metal layer with the first preliminary gate structure and the substrate underneath the first solicidation-controlling layer pattern to form a first gate structure and a second silicide layer pattern on the first impurity region, respectively, the first gate structure including an uppermost first metal silicide layer pattern having a first thickness, and the second silicide layer pattern having a second thickness thinner than the first thickness.

10. The method of claim 9, wherein:
   the step of forming the first preliminary gate structure includes the following,
      forming a tunnel oxide layer pattern on the substrate,
      forming a first polysilicon layer pattern on the tunnel oxide layer pattern,
      forming a dielectric layer pattern on the first polysilicon layer pattern, and
      forming a second polysilicon layer pattern on the dielectric layer pattern,
   the step of forming the second gate structure includes the following,
      forming a gate oxide layer pattern on the substrate, and
      forming a third polysilicon layer pattern on the gate oxide layer pattern; and
   the step of forming a first preliminary gate structure and a second preliminary gate structure forms a plurality of at least the first preliminary gate structure.

11. The method of claim 9, wherein a first interval between a first type of sidewall on a first instance of the first preliminary gate structure and the first type of sidewall on a second instance of the first preliminary gate structure adjacent to the first instance of the first preliminary gate structure sidewall is narrower than a second interval between a second type of sidewall on the first instance of the first preliminary gate structure opposite to the first type of sidewall and the second type of sidewall on a third instance of the first preliminary gate structure adjacent to the second instance of the first preliminary gate structure, and
   a first one of the spacers positioned against on the first type of sidewall of the first instance of the first preliminary gate structure makes contact with a second one of the spacers positioned against the first sidewall of the second instance of the first preliminary gate structure.

12. The method of claim 9, wherein forming the second silicidation controlling layer includes:
   forming a silicon oxide layer on the first preliminary gate structure, the second preliminary gate structure, the spacers and the substrate, and
   forming a silicon nitride layer on the silicon oxide layer.

13. The method of claim 12, wherein an interval between the second preliminary gate structures is wider than that between the first preliminary gate structures.

14. The method of claim 13, wherein the step of forming the first silicidation-controlling layer pattern and the second silicidation-controlling layer pattern includes:
   partially etching the silicon nitride layer to selectively expose the silicon oxide layer in the first region,
   forming a photoresist film on the etched silicon nitride layer and the exposed silicon oxide layer,
   blank-exposing the photoresist film to form a photoresist structure selectively masking the substrate between the first preliminary gate structures,
   partially etching the exposed silicon oxide layer in the first region to form the first silicidation-controlling layer pattern on the substrate in the first region and the second silicidation-controlling layer pattern on the substrate in the second region, the first silicidation-controlling layer pattern including a silicon oxide layer pattern, and the second silicidation-controlling layer pattern including a silicon oxide layer pattern and a silicon nitride layer pattern, and
   removing the photoresist structure.

15. The method of claim 9, further comprising:

forming a third gate structure including a third metal silicide layer pattern, which has a third thickness, on a third region of the substrate, forming impurity regions in the substrate at both sides of the third gate structure, and forming a fourth metal silicide layer pattern having a fourth thickness substantially similar to the third thickness on the impurity regions.

16. A method of manufacturing a semiconductor device, comprising:

forming a first preliminary gate structure and a second preliminary gate structure including uppermost polysilicon layers, respectively, on first and second regions of a substrate, respectively, forming first and second impurity regions in the substrate at each of both sides of the first preliminary gate structure and the second preliminary gate structure, forming spacers against sidewalls of the first preliminary gate structure and the second preliminary gate structure, forming a silicidation-blocking layer on the first preliminary gate structure, the second gate structure, the spacers and the substrate, forming a photoresist structure masking a portion of the substrate between the first preliminary gate structures and another portion of the substrate corresponding substantially to the entire second region, partially etching the silicidation-blocking layer using the photoresist structure as an etching mask to form a silicidation-blocking layer pattern selectively exposing the first preliminary gate structure, forming a metal layer on the first preliminary gate structure and the silicidation-blocking layer pattern, and reacting the metal layer with the first preliminary gate structure to form a first gate structure including a first metal silicide layer pattern in the first region.

17. The method of claim 16, wherein forming the photoresist structure comprises:

forming a photoresist film on the silicidation-blocking layer, selectively exposing the photoresist film in the first region under a condition that a portion of the photoresist film overlying the substrate located between the first preliminary gate structures is not sufficiently exposed, and developing the exposed photoresist film.

18. A method of manufacturing a semiconductor device, comprising:

forming a first preliminary gate structure and a second preliminary gate structure including uppermost polysilicon layers, respectively, on first and second regions of a substrate, respectively, forming first and second impurity regions in the substrate at each of both sides of the first preliminary gate structure and the second gate structure, forming spacers on sidewalls of the first preliminary gate structure and the second preliminary gate structure, forming a silicidation-blocking layer pattern on the second region, covering the first preliminary gate structure and the second preliminary gate structure with a fluidic oxide layer, etching the fluidic oxide layer to form a fluidic oxide layer pattern on a portion of the substrate located between the first preliminary gate structures, forming a metal layer on the first preliminary gate structure and the silicidation-blocking layer pattern, and reacting the metal layer with the first preliminary gate structure to form a first gate structure including a first metal silicide layer pattern in the first region.

19. The method of claim 18, wherein forming the fluidic oxide layer comprises:

depositing a fluidic oxide material including silicon atoms by a spin coating process, and annealing the fluidic oxide material to harden the fluidic oxide material.

20. The method of claim 4, wherein the second gap between the second type of sidewall of the second instance of the gate structure and the second type of sidewall of the adjacent third instance of the gate structure is sufficiently large that a void remains between a third one of the spacers positioned against the second type of sidewall of the first instance of the second gate structure and a fourth one of the spacers positioned against the second type of sidewall of the third instance of the gate structure.

* * * * *